(12) United States Patent
Curran et al.

(10) Patent No.: US 11,371,157 B2
(45) Date of Patent: *Jun. 28, 2022

(54) PROCESS FOR INCORPORATING ZINC INTO A DYED ANODIZED LAYER FOR PROTECTING DYE COLORANTS FROM LIGHT EXPOSURE

(71) Applicant: Apple Inc., Cupertino, CA (US)

(72) Inventors: James A. Curran, Morgan Hill, CA (US); Sonja R. Postak, Sunnyvale, CA (US); Karin H. Rasmussen, Cupertino, CA (US); James A. Dean, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 491 days.

This patent is subject to a terminal disclaimer.

(21) Appl. No.: 16/360,871

(22) Filed: Mar. 21, 2019

(65) Prior Publication Data

US 2020/0173050 A1    Jun. 4, 2020

Related U.S. Application Data

(60) Provisional application No. 62/773,973, filed on Nov. 30, 2018.

(51) Int. Cl.
*C25D 11/34* (2006.01)
*H05K 5/04* (2006.01)
*G06F 1/16* (2006.01)
*C25D 11/24* (2006.01)

(52) U.S. Cl.
CPC .......... *C25D 11/243* (2013.01); *C25D 11/246* (2013.01); *C25D 11/34* (2013.01); *H05K 5/04* (2013.01); *G06F 1/1656* (2013.01)

(58) Field of Classification Search
None
See application file for complete search history.

(56) References Cited

U.S. PATENT DOCUMENTS

| 2017/0088968 | A1 | 3/2017 | Curran et al. |
| 2017/0121838 | A1* | 5/2017 | Tatebe ................ H05K 5/0243 |
| 2018/0263130 | A1 | 9/2018 | Curran et al. |
| 2019/0382911 | A1* | 12/2019 | Curran .................. C25D 11/34 |
| 2021/0363654 | A1* | 11/2021 | Wu ........................ C23C 28/00 |

FOREIGN PATENT DOCUMENTS

| CN | 101812713 A | 8/2010 |
| WO | 2018145780 A1 | 8/2018 |

* cited by examiner

*Primary Examiner* — James Wu
*Assistant Examiner* — Christopher L Augustin
(74) *Attorney, Agent, or Firm* — Dorsey & Whitney, LLP

(57) ABSTRACT

This application relates to a method for forming an enclosure for a portable electronic device, the enclosure including a metal substrate that is overlaid by an anodized layer. The method includes dyeing the anodized layer by exposing pores of the anodized layer to a dye. The method further includes sealing the dye within the pores by exposing the anodized layer to a zinc-based sealing solution, where an external surface of the anodized layer having the pores that are sealed includes an amount of zinc between about 3 wt % to about 6 wt %.

13 Claims, 20 Drawing Sheets

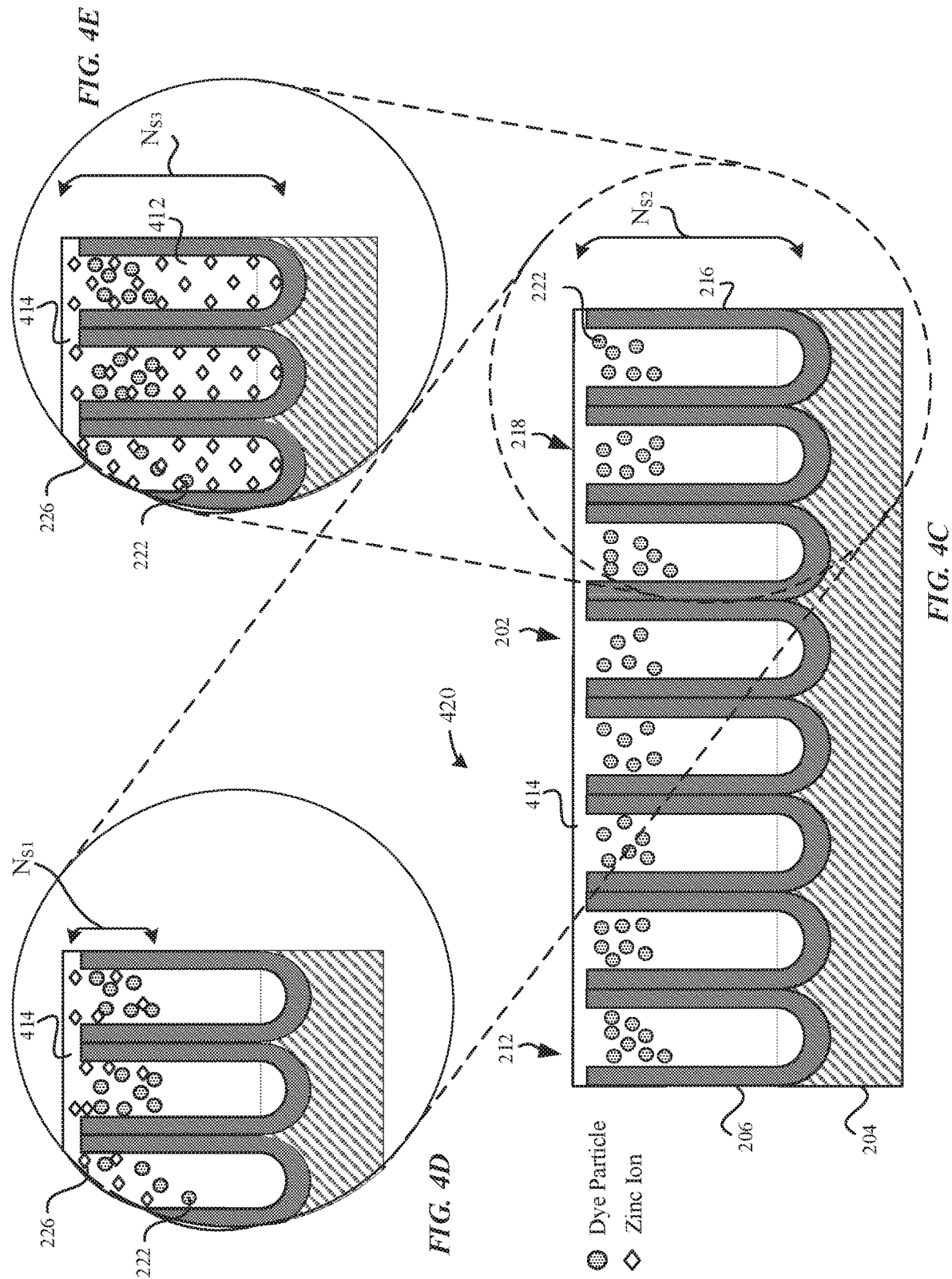

|  | Nickel Acetate |  |  |  | Zinc Acetate |  |  |  |
|---|---|---|---|---|---|---|---|---|
|  | CLR #1 | CLR #2 | CLR #3 | CLR #4 | CLR #1 | CLR #2 | CLR #3 | CLR #4 |
| Time 1 | 0.4 | 0.4 | 1.0 | 0.9 | 0.4 | 0.5 | 0.5 | 0.4 |
| Time 2 | 0.3 | 0.2 | 1.4 | 1.4 | 0.5 | 0.5 | 0.7 | 0.7 |
| Time 3 | 0.3 | 0.3 | 1.8 | 2.0 | 0.6 | 0.6 | 1.4 | 1.2 |

*FIG. 9A*

|  | Nickel Acetate | | | Zinc Acetate | | |
|---|---|---|---|---|---|---|
|  | RR | OG | BL | RR | OG | BL |
| Time 1 | 0.5 | 1.8 | 1.0 | 1.1 | 0.4 | 1.0 |
| Time 2 | 0.7 | 2.6 | 1.2 | 2.0 | 0.8 | 1.8 |
| Time 3 | 0.5 | 2.4 | 1.6 | 1.5 | 1.1 | 2.1 |

*FIG. 9B*

PROCESS FOR INCORPORATING ZINC INTO A DYED ANODIZED LAYER FOR PROTECTING DYE COLORANTS FROM LIGHT EXPOSURE

CROSS-REFERENCE TO RELATED APPLICATIONS

The present application claims the benefit of U.S. Provisional Application No. 62/773,973, entitled "PROCESS FOR INCORPORATING ZINC INTO A DYED ANODIZED LAYER FOR PROTECTING DYE COLORANTS FROM LIGHT EXPOSURE," filed Nov. 30, 2018, the content of which is incorporated herein by reference in its entirety for all purposes.

The present application is related to U.S. Provisional Application No. 62/685,816, entitled "ZINC-BASED SEAL FOR ANODIZED PARTS," filed Jun. 15, 2018 and related to U.S. Non-Provisional application Ser. No. 16/104,477, entitled "DYE SOLUTION ALTERNATIVES FOR REDUCED DYE UPTAKE IN ANODIZED LAYERS," filed Aug. 17, 2018, the contents of which are incorporated herein by reference in its entirety for all purposes.

FIELD

The described embodiments relate generally to incorporating zinc into anodized parts that are used in consumer portable electronic devices. More particularly, the described embodiments relate to techniques for incorporating zinc into dyed anodized parts in order to minimize the color change of these dyed anodized parts when exposed to light.

BACKGROUND

Enclosures for portable electronic devices can include an anodized layer that may be dyed in different colors such that the enclosures are more cosmetically appealing to consumers. However, these dyed enclosures may be exposed to environmental conditions, such as ultraviolet (UV) light, that lead to premature and accelerated color loss. Although anodized layers may be sealed so as to lock dye within pores of the anodized layers, conventional sealants are insufficient in protecting many of the desirable dye colors from UV exposure. In order to protect dyed enclosures from premature color loss and to provide a wider variety of different colors, there is a need for more effective sealing solutions.

SUMMARY

The described embodiments relate generally to incorporating zinc into anodized parts that are used in consumer portable electronic devices. More particularly, the described embodiments relate to techniques for incorporating zinc into dyed anodized parts in order to minimize the color change of these dyed anodized parts when exposed to light.

According to some embodiments, a method for forming an enclosure for a portable electronic device, the enclosure including a metal substrate that is overlaid by an anodized layer, is described. The method includes dyeing the anodized layer by exposing pores of the anodized layer to a dye. The method further includes sealing the dye within the pores by exposing the anodized layer to a zinc-based sealing solution, where an external surface of the anodized layer having the pores that are sealed includes an amount of zinc between about 3 wt % to about 6 wt %.

According to some embodiments, an enclosure for a portable electronic device is described. The enclosure includes a metal alloy substrate and an anodized layer formed from and overlaying the metal alloy substrate, where the anodized layer includes (i) pores having dye disposed therein, and (ii) a sealant that seals the dye within the pores of the anodized layer, wherein an external concentration of zinc at an external surface of the anodized layer includes between about 3 wt % to about 6 wt % of zinc.

According to some embodiments, a method for forming an enclosure for a portable electronic device, the enclosure including a metal alloy substrate, is described. The method includes forming an anodized layer that overlays the metal alloy substrate. The method further includes exposing the anodized layer to a zinc-based solution such that an external surface of the anodized layer has a concentration of zinc that is between about 3 wt % to about 6 wt %.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

FIGS. 4A-4E illustrate cross-sectional views of a process for incorporating zinc ions into an anodized substrate, in accordance with some embodiments.

FIGS. 9A-9B illustrate exemplary graphs indicating color shift as a relationship of light exposure time in anodized substrates, in accordance with some embodiments.

DETAILED DESCRIPTION

Figure 1:
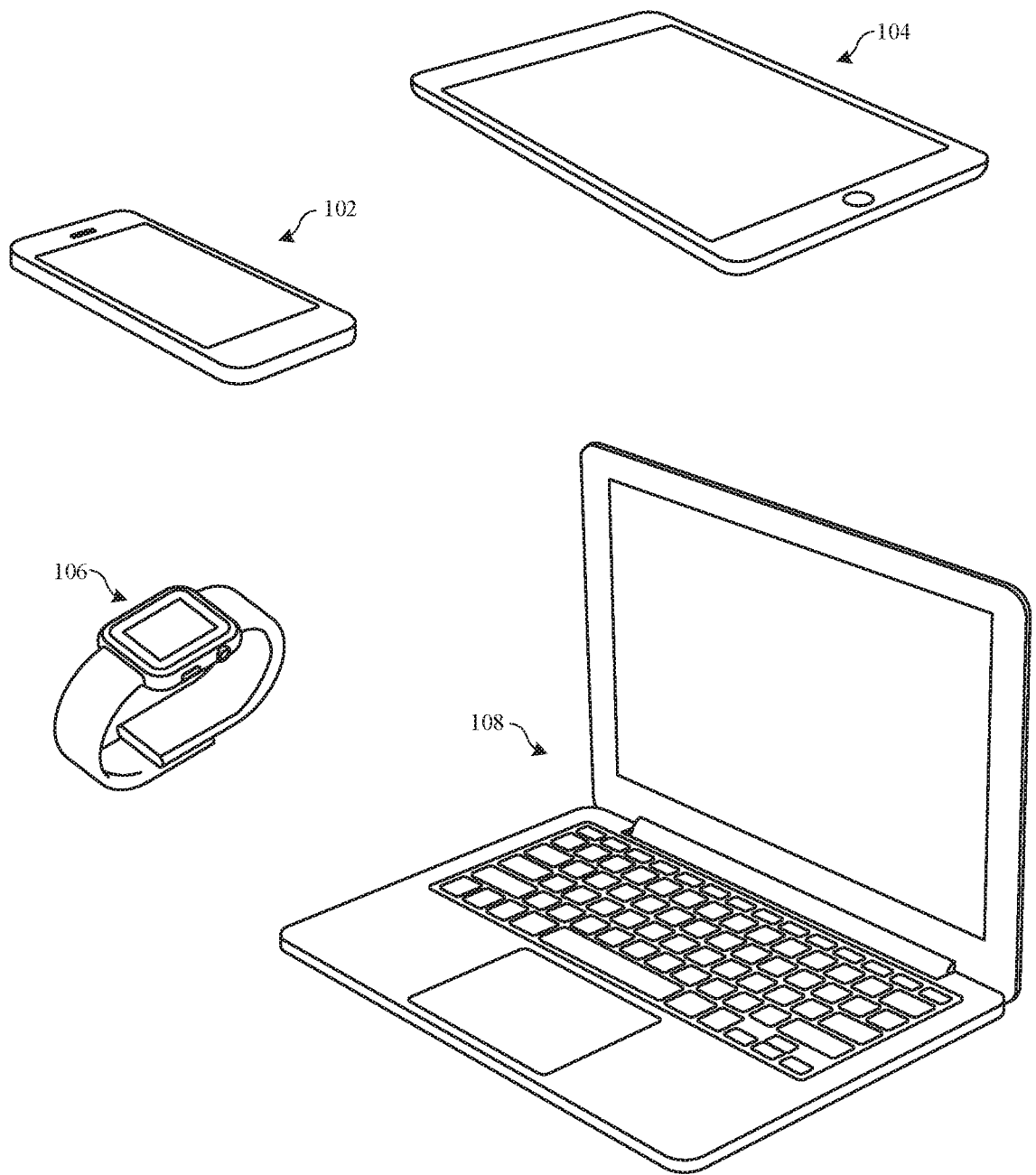
FIG. 1 illustrates perspective views of various portable electronic devices having enclosures that may be processed using the techniques described herein, in accordance with some embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Although it has been well established that nickel acetate is generally undesirable for use in forming anodized substrates due to its toxicity, decades of research and development has yet to produce a non-toxic sealing alternative that can reliably pass sealing tests, let alone match the performance of a nickel acetate-sealed surface. Indeed, there are no commercially available alternatives which meet the standards for reliability required in the consumer electronics device industry. Additionally, the alternative sealing solution will ideally need to be implemented as a single-step process, not requiring additional equipment, time or processing tanks. Moreover, the sealing alternative should also yield similar, tightly controlled color distributions across a wide range of dye colors.

The embodiments described herein set forth techniques for providing an alternative to a nickel acetate sealant that also improves lightfastness of color dyes of anodized layers as a result of exposure to environmental conditions. In particular, the techniques described herein set forth incorporating zinc ions into the anodized layers in order to improve lightfastness of color dyes that are deposited in pores. Many dyes used to color anodized layers are organic colorants that are susceptible to degradation when exposed to UV light. Notably, conventional techniques for sealing anodized layers include nickel-based seals. However, nickel compounds (e.g. nickel-based seals, etc.) weakly attenuate UV light. In contrast, zinc compounds demonstrate a surprising and unexpected benefit of strongly attenuating UV light. Indeed, zinc compounds (e.g. zinc oxide, etc.) strongly absorb UV light in the UVA and UVB spectrums.

Zinc compounds may be incorporated into the anodized layers through a combination of different processes. For example, zinc compounds may be incorporated via at least one of a zinc-based sealing process, a zinc-based dyeing process or a zinc-based buffer solution. In other words, a manufacturer is not limited to merely incorporating zinc through only a zinc-based sealing process. Beneficially, this yields improved flexibility of incorporating zinc throughout the manufacturing process.

Furthermore, zinc-based seals may be more preferable to manufacturers as an alternative to nickel-based seals because nickel-based seals are generally undesirable due to the toxicity of nickel salts. In contrast, zinc is shown to be a suitable non-toxic replacement for nickel that matches or exceeds the performance of nickel-based seals. Moreover, nickel salts present in dyed anodized parts are also known to cause dermatitis (i.e. allergic skin reactions) in users. Unlike nickel, zinc is non-toxic: one of its major uses is as a dietary supplement. It is readily available and significantly less expensive than nickel—especially when safe disposal of used chemistry is taken into account. Moreover, zinc demonstrates an ability to stabilize colorants to at least the same degree as nickel. Furthermore, zinc ions are of the same 2+ charge as nickel, and of similar or very slightly larger ionic radius to nickel. Moreover, zinc sealed anodized aluminum exhibits at least equivalent performance to nickel sealed anodized aluminum in the relevant long term exposure tests. Moreover, the color shift of dyed anodized parts using zinc is very minimal—at least equivalent to nickel. A repeatable, controllable dE94 of <1 is observed from the post-dye stage to the final product, which is very important in the consumer electronic space where thousands of parts are dyed in a single dye bath, and uniformity of color dye is of critical importance to the aesthetics of these consumer enclosures. Additionally, zinc included in the anodized layer demonstrates an impedance that is at least equivalent to nickel, which indicates that a similar degree of physical plugging of the pores and electrochemical resistance has been established across the sealed anodized layers. Finally, zinc acetate is a very effective substitute for the consumer electronic device industry because the touch and feel of the sealed anodized surface is very similar to that achieved using nickel acetate sealing.

Anodized enclosures that are dyed and subsequently sealed may be tested using a variety of different tests. For example, the anodized enclosures are tested for protection against absorption of dirt and stains into the pore structures. One test involves a "dye spot test" wherein the inability of a sealed anodized surface to absorb dye is measured. In particular, a spot is made on the anodized surface using an indelible marker, and then an attempt is made to remove the spot with scrubbing and only water as a solvent. Only if there is no residual mark is the anodized surface considered to pass the threshold and to have adequate stain-resistance and seal quality.

Another test involves controlled exposure of the anodized surface to a wide range of chemicals to which the anodized surface might be reasonably expected to be exposed during its service life. Examples include substances such as sweat, sebum, oleic acid, sunscreen, hand-sanitizer, lipstick, ketchup, mustard, hot coffee, carbonated drinks, and various household and industrial cleaners and solvents. These chemicals are typically studied by controlled application to the surface, followed by a heat soak at 65° C. and 95% relative humidity for 72 hours, and then a light cleaning procedure before careful inspection of the surface for staining and any surface damage. Only minimal levels of discoloration will be tolerated.

Another test involves longer term environmental exposure, such as light exposure, heat exposure, ocean water exposure, alternating sweat immersion, and the like. Yet another test involves the quantitative measures of electrochemical impedance spectroscopy (EIS), a simplified variant of EIS performed at a fixed frequency (typically 1 kHz) called admittance testing, and acid dissolution testing (ADT).

According to some embodiments, a method for forming an enclosure for a portable electronic device, the enclosure including a metal substrate that is overlaid by an anodized layer, is described. The method includes dyeing the anodized layer by exposing pores of the anodized layer to a dye. The method further includes sealing the dye within the pores by exposing the anodized layer to a zinc-based sealing solution, where an external surface of the anodized layer having the pores that are sealed includes an amount of zinc between about 3 wt % to about 6 wt %.

As used herein, the terms anodic film, anodized film, anodic layer, anodized layer, anodic oxide coating, anodic layer, anodic oxidized layer, metal oxide layer, oxide film, oxidized layer, and oxide layer can be used interchangeably and refer to any appropriate oxide layers. The oxide layers are formed on metal surfaces of a metal substrate. The metal substrate can include any of a number of suitable metals or metal alloys. In some embodiments, the metal substrate can include aluminum, and the aluminum is capable of forming an anodized layer when oxidized. In some embodiments, the metal substrate can include an aluminum alloy. It should be noted that the processes for forming an anodized layer and a metal oxide layer may be different. As used herein, the terms part, layer, segment, and section can also be used interchangeably where appropriate.

These and other embodiments are discussed below with reference to FIGS. 1, 2A-2B, 3A-3C, 4A-4E, 5-8, 9A-9B, 10-13, 14A-14B, and 15; however, those skilled in the art will readily appreciate that the detailed description given herein with respect to these figures is for explanatory purposes only and should not be construed as limiting.

FIG. 1 illustrates various portable electronic devices that can be processed using the techniques as described herein. The techniques as described herein can be used to process metallic surfaces (e.g. metal oxide layers, etc.) of enclosures of the portable electronic devices. In some examples, the techniques described herein may be used to color the metallic surfaces by causing dye particles to become absorbed within the metallic surfaces. In some examples, the techniques described herein may be used to seal pore structures of anodized layers such as to prevent external contaminants from reaching the underlying metal substrate. Additionally, sealing the pore structures also prevents the dye particles from leaching out of the anodized layer. FIG. 1 illustrates exemplary portable electronic devices including a smartphone 102, a tablet computer 104, a smartwatch 106, and a portable computer 108. These exemplary portable electronic devices may be capable of using personally identifiable information that is associated with one or more users. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The anodized layer may have sufficient hardness such that the anodized layer functions as a protective coating to protect the metal substrate, for example, when these portable electronic devices are dropped, scratched, chipped, abraded, or exposed to various corrosive contaminants. In some examples, the anodized layer includes pore structures (or pores) that are formed through a portion of the anodized layer. The pore structures extend from an external surface of the anodized layer and terminate at a bottom surface/terminus surface. The anodized layer may be separated from the underlying metal substrate by a non-porous barrier layer.

Additionally, each of the pore structures of the anodized layer is capable of receiving dye particles which can imbue the anodized layer with a specific color that corresponds to the dye particles. In particular, the anodized layer may be dyed prior to sealing the anodized layer. Dyeing the anodized layer enables the metallic surface to be imbued with a wider range of colors. In particular, the pore structures may have a diameter between about 20 nm to about 40 nm, which is large enough to receive the dye particles. Several parameters may influence and control uptake of dye particles into the pore structures which may include dye concentration, chemistry of the dye solution, pH of dye solution, temperature of dye solution, and dyeing time, as will be described in greater detail herein. Subsequent to dyeing the metallic surface, the pore structures are sealed so that the dye particles are physically retained within the pore structures. In some examples, the color of the metal oxide layer may be characterized according to CIE L*a*b* color-opponent dimension values. The L* color opponent dimension value is one variable in an L*a*b* color space. In general, L* corresponds to an amount of lightness. L*=0 represents the darkest black while L*=100 represents white In general, a* indicates amounts of red color and green color in a sample. A negative a* value indicates a green color, while a positive a* value indicates a red color. Accordingly, samples having a positive a* value will indicate that more red than green is present. In general, b* indicates amounts of blue color and yellow color in a sample. A negative b* value indicates a blue color, while a positive b* value indicates yellow color. Accordingly, samples having a positive b* value will indicate more yellow than blue is present.

Figure 2A:
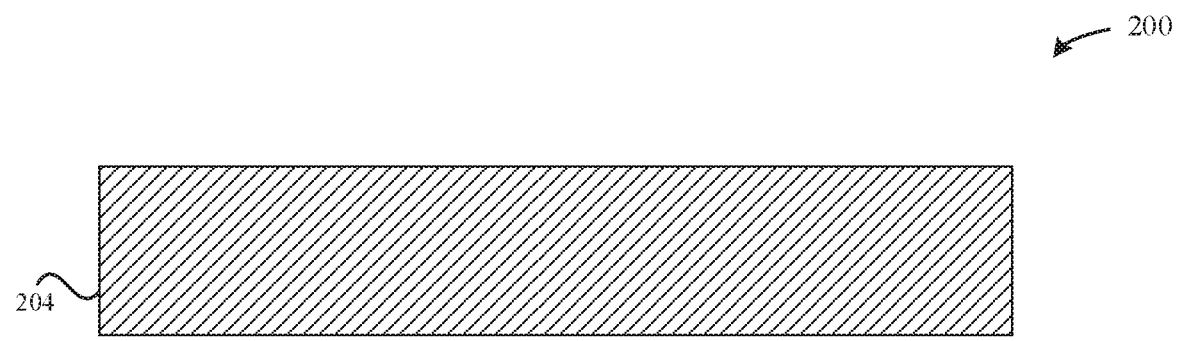
FIGS. 2A-2B illustrate cross-sectional views of a process for forming an anodized substrate, in accordance with some embodiments.
Figure 2B:
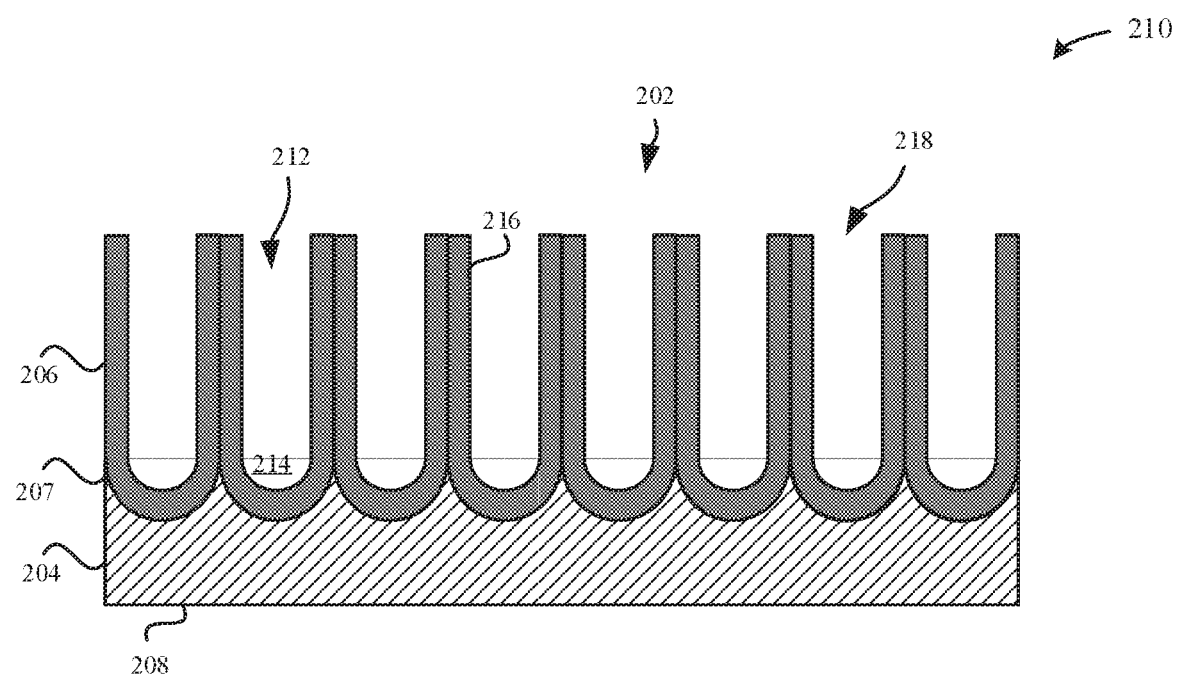

FIGS. 2A-2B illustrate cross-sectional views of a process for forming an anodized substrate, in accordance with some embodiments. In some embodiments, a metal part 200 that is being processed has a near net shape of a final part, such as the enclosures of the portable electronic devices 102, 104, 106, and 108.

FIG. 2A illustrates the metal part 200 prior to undergoing an anodization process. In some examples, the metal part 200 may correspond to the metal substrate 204. The metal substrate 204 may have any thickness that is suitable for providing sufficient strength, hardness and rigidity to protect electronic component(s) that are carried within the portable electronic device and to protect brittle components (e.g. ceramic, glass, etc.) of the enclosure. The metal substrate 204 may be subject to one or more pre-anodization processes. In some examples, the pre-anodization processes of the metal substrate 204 include at least one of polishing, texturizing, buffing, cleaning, and the like. Beneficially, in this manner, surface(s) of the metal substrate 204 may assume any number of desired surface geometries and surface finishes. In some examples, the metal substrate 204 is a three-dimensional structure having a height, width, and depth, and the metal substrate 204 can have any type of geometry that is suitable for forming an overlaying anodized layer, as will be described in greater detail herein. In particular, the geometry of the metal substrate 204 is characterized as rectangular, polygonal, circular, beveled edges, angular edges, elliptical, etc.

FIG. 2B illustrates an anodized part 210, in accordance with some embodiments. For example, the anodized part 210 corresponds to the metal substrate 204 after undergoing the anodization process. As illustrated in FIG. 2B, an anodized layer 206 is formed from and overlays the metal substrate 204. The anodized layer 206 may include an external surface 202, where the external surface 202 of the anodized layer 206 may be generally parallel to a bottom surface 208 of the metal substrate 204. In some examples, the anodized layer 206 is formed as a result of an electrolytic anodizing process. In particular, during the electrolytic anodizing process, a portion of the metal substrate 204 is converted or consumed by the conversion to the anodized layer 206. According to some examples, the anodized layer 206 has a thickness between about 1 micrometer and several tens of micrometers. In some examples, the thickness is between about 5 micrometers and about 15 micrometers.

It should be noted that the transparency of the anodized layer 206 is proportional to the thickness of the anodized layer 206. If the anodized layer 206 is thicker than e.g. 15 micrometers, then there is a risk that the anodized layer 206 is less transparent, which may be undesirable for permitting for the dye color to show through the anodized layer 206. Moreover, the thicker the anodized layer 206, the more likely the anodized layer 206 will become soft, susceptible to becoming brittle, and provide diminished abrasion protection. Thus, merely increasing the thickness of the anodized layer 206 in order to improve color dye retention is generally impractical. Furthermore, the anodized layer 206 is preferably transparent to permit for light to pass through the anodized layer 206. By increasing the amount of visible light that passes through, the dye color shows more readily through the anodized layer 206. However, paler shades of dye colors, lower oxide thickness, lower seal quality, and softer oxide layers may also contribute to lower light fastness of dye colors.

According to some embodiments, the anodized layer 206 includes pore structures 212 that extend from the external surface 202 of the anodized part 210 towards the metal substrate 204. The pore structures 212 may include bottom surfaces 214. The pore structures 212 are defined by pore walls 216 characterized as having generally columnar shapes that are elongated in a direction generally perpendicular to a central plane of the external surface 202 of the anodized part 210. The pore structures 212 include openings 218 that may be sealed via a sealing process, as described in greater detail herein. According to some examples, the pore structures 212 range in diameter from about 10 nm to about 500 nm. In some examples, the pore structures 212 have diameters between about 20 nm to about 50 nm. The pore structures 212 include openings 218 that may be sealed via a sealing process, as described in greater detail herein.

According to some examples, the metal substrate 204 may include aluminum or an aluminum alloy. The aluminum alloy can include one or more alloying elements, such as zinc. As a result, when the metal substrate 204 is anodized, the zinc from the metal substrate 204 is partially incorporated into the anodized layer 206—although it may also be dissolved in the anodizing bath. However, it should be noted that regardless of the amount of concentration of zinc present in the metal substrate 204, there is at most about 1 wt % of zinc from the metal substrate 204 that is incorporated into the anodized layer 206. For example, if the metal substrate 204 includes 5.5 wt % zinc, there would be a maximum of 1 wt % of zinc incorporated into the anodized layer 206 from the metal substrate 204. Additionally, any contribution of zinc from the metal substrate 204 would show a continuous decline in concentration as the concentration of zinc decreases from the metal substrate/anodized layer interface 207 towards the external surface 202 of the anodized layer 206. In other words, the concentration of zinc contributed from the metal substrate 204 is greatest at the metal substrate/anodized layer interface 207. In contrast, the concentration of zinc in the anodized layer 206 that is contributed from a zinc-based sealing solution is greatest at the external surface 202 of the anodized layer 206.

Figure 3A:
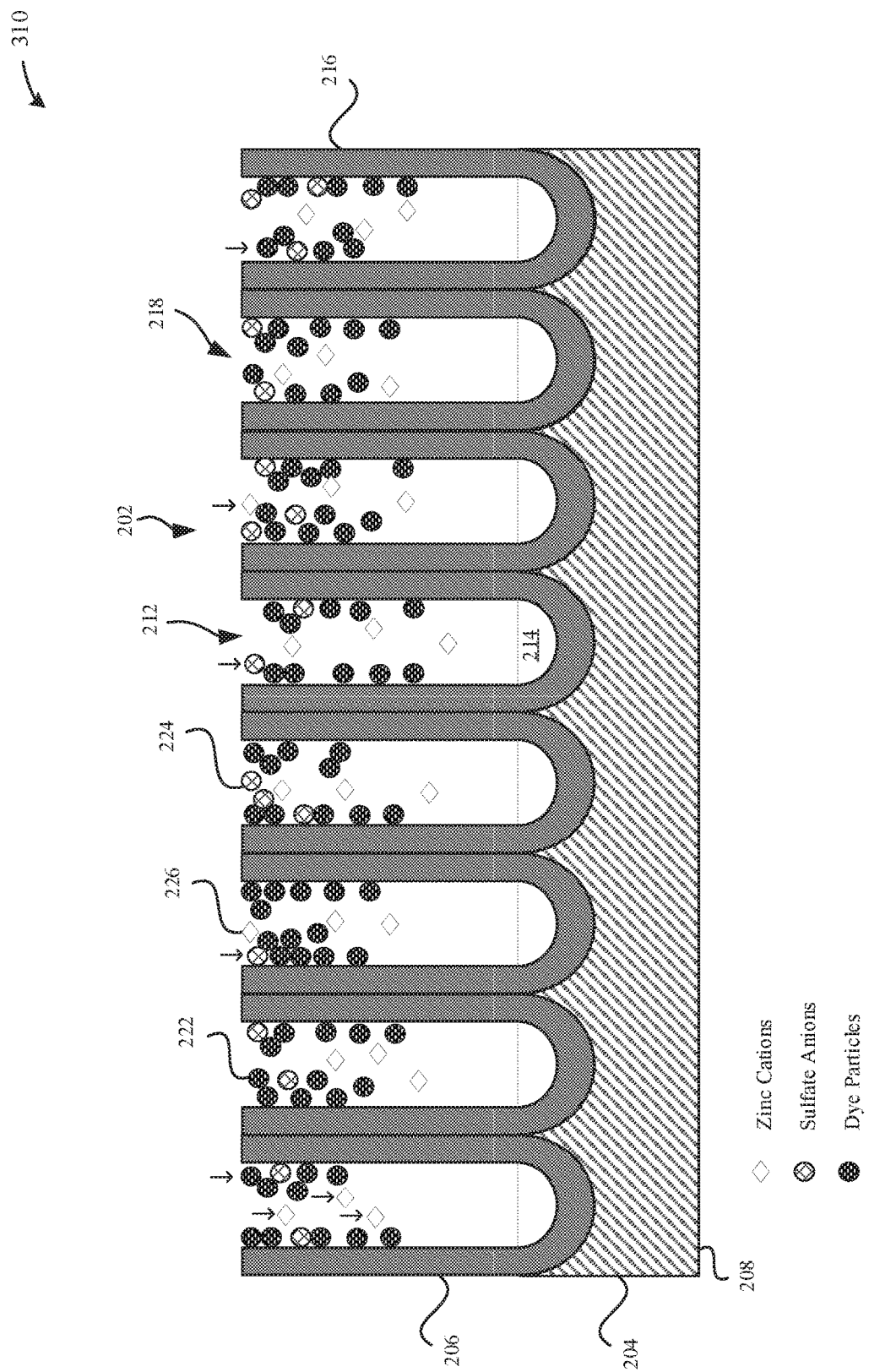
FIGS. 3A-3C illustrate various views of a process for incorporating zinc ions into an anodized substrate, in accordance with some embodiments.

FIG. 3A illustrates a dyed part 310 subsequent to a dyeing process, in accordance with some embodiments. During the dyeing process, the anodized layer 206 may be exposed to a dye solution that includes dye particles 222 and zinc cations 226, where the zinc cations are subsequently incorporated into the anodized layer 206.

As illustrated in FIG. 3A, the anodized layer 206 includes dye particles 222 that are absorbed within the pore structures 212. In particular, the dyed part 310 is exposed to a dye solution that includes dye particles 222 and zinc cations 226. The dye particles 222 may be aqueous organic dyes that are capable of binding to numerous sites along the pore walls 216. In some examples, these sites include aluminum or hydrated aluminum gel of the aluminum oxide of the pore walls 216. In order to limit the number of sites for absorption of the dye particles 222, the dye solution may include anions 224, such as sulfate ($SO_4^{2-}$) ions, phosphate ions, silicate ions, and the like, which are also capable of competing with the dye particles 222 for binding to these sites of the pore walls 216. Accordingly, the anions 224 limit the number of sites along the pore walls 216 that are capable of binding to the dye particles 222. In some examples, the anions 224 may include at least one of acetates, sulfates, oxalates, citrates, carbonates, or nitrates. In some examples, the dye solution may include $ZnSO_4$ as a source of the sulfate ions. In particular, zinc ($Zn^{2+}$) is a divalent metal cation having a valence of two, which is to mean that an equivalent concentration of the active anionic species (sulfate ions) can be incorporated into the dye solution with only half the concentration of corresponding cations (i.e. $Zn^{2+}$) as compared to cations from an equivalent sulfate concentration achieved using the conventional approach of sodium sulfate as the dye bath additive. The source of the sulfate ions (e.g. $ZnSO_4$) includes divalent metal cations 226, which may be absorbed into the pore structures 212.

As illustrated in FIG. 3A, subsequent to the dyeing process, the zinc cations 226 are non-uniformly distributed throughout the pore structures 212. In some embodiments, the concentration of the zinc cations 226 is greater in regions of the pore structures 212 that correspond to the openings 218 and the concentration of the zinc cations 226 decreases towards regions of the pore structures 212 that correspond to the bottom surfaces 214. In some examples, the external surface 202 has a peak concentration of zinc of about 6 wt %. In some examples, the peak concentration of zinc is between about 5 wt % to about 20 wt %. In some examples, the peak concentration of zinc is between about 3 wt % to about 6 wt %. The tapering off of the peak concentration of the zinc cations 226 further away from the external surface 202 may be due to the distance by which the zinc cations 226 must be absorbed into the pore structures 212. The presence of the zinc cations 226 can be detected using fluorescent imaging or x-ray fluorescence (XRF).

According to some examples, the dye solution includes between about 1 g/L to 10 g/L of zinc acetate together with acetic acid to be used as a pH stabilizing buffer. According to some examples, the dye solution includes between about 0.1 g/L to about 1 g/L of ZnSO4. In some examples, the dye solution includes between about 0.1 g/L to less than 10 g/L of ZnSO4. Beneficially, the source of sulfate ions within the dye solution can slow the uptake of the dye particles 222 into the pore structures 212. By slowing the uptake of the dye particles 222, there is increased control of the color and uniformity of color among multiple anodized parts that are exposed as a single batch to the dye solution. It should be noted that a dye solution with a concentration of less than 0.1 g/L produces less uniformity of color and patchy uptake of dye particles 222 at the pore walls 216 due to solution flow dynamics and local depletion of the dye solution. Additionally, a concentration of greater than 10 g/L of dye is not ideal for producing uniform color across multiple parts in a single batch due to intense color saturation of the dye particles 222.

In some examples, the zinc cations 226 may have a large radius which may be beneficial in reducing their mobility to pass through the pore structures 212. Furthermore, it should be noted that although sulfates anions are effective at inhibiting uptake of dye particles into pore structures, other anions (e.g. phosphates, silicates, etc.) should be considered as effective substitutes for anions 224 for reducing uptake of dye particles into the pore structures. Although these other anions may inhibit the sealing of the pore structures, this may be acceptable where alternative sealing methods (e.g. silicate sealing, etc.) is implemented. Furthermore, other ions such as acetates, oxalates, citrates, carbonates or nitrates may be utilized instead of sulfate anions to achieve slow uptake of dye particles into the pore structures 212.

According to some embodiments, zinc cations may be preferable over other metal cations (e.g. sodium) for dyeing the anodized layer 206. For example, sodium (Na+), may have deleterious effects on the performance of the hydrothermal seal of the pore structures and the anodized layer. In particular, anodized layers that include sodium cations deposited within pore structures have lower impedance values relative to anodized layers that include zinc cations. Indeed, higher impedance values indicate lower susceptibility to corrosion. When $Na_2SO_4$ as a source of sodium cations is added to the dye solution, the presence of sodium ions that is sealed within the anodized layer provides a relatively mobile species for ionic conduction through the anodized layer to reach the metal substrate. Moreover, the presence of sodium ions may degrade the hydrothermal seal performance by about 50% due to a reduction in impedance of the anodized layer. This reduction in impedance allows for greater conductivity of corrosion-causing ions (e.g. chloride ions) to pass through the anodized layer. Consequently, degrading the hydrothermal seal renders the anodized layer more susceptible to corrosion when exposed to external contaminants (e.g. saltwater during a surf session). This degradation in the hydrothermal seal performance may be attributed to the incorporation of sodium ions into the pore structures.

According to some embodiments, although the dyed part 310 includes a limited number of zinc cations 226 within the anodized layer 206, it should be noted that there are substantially fewer zinc cations 226 retained within the anodized layer 206 when using a zinc-based dye solution as a source of sulfate ions (ZnSO4) instead of using monovalent ions (e.g. sodium, etc.) as a source of sulfate ions (e.g. $Na_2SO_4$). Indeed, by using $ZnSO_4$ as a source of sulfate ions in the dye solution, when compared to $Na_2SO_4$, an equivalent concentration of the sulfate ions can be achieved in the dye solution with only half of the concentration of corresponding cations. Beneficially, the use of $ZnSO_4$ as a source of sulfate ions (or other divalent metal cations) leads to lower levels of cation retention within the anodized layer 206, and lower levels of ionic mobility or ion conductivity through the anodized layer 206. It should be noted that the use of zinc cations 226 compared to monovalent metal ions (e.g. sodium, etc.) may impart equivalent or better reduction of dye particles 222 uptake by the pore structures 212.

Furthermore, the impedance of the anodized layer 206 as measured in $\Omega$ is attributed to the presence of pore structures 212. In contrast, the barrier layer (not illustrated) between the anodized layer 206 and the metal substrate 204 does not include pore structures 212, and is not as susceptible to low impedance. When measuring the impedance of the anodized layer 206 of the dyed part 310 that includes zinc cations 226, the impedance of the dyed part 310 does not reduce between t0 and t24 immersion measures, indicating that the anodized layer 206 is not as susceptible to corrosion during long-term exposure of the dyed part 310 to external contaminants (e.g. moisture, chlorine, salt, etc.). In contrast, dyed parts having anodized layers that include monovalent metal cations (e.g. sodium, etc.) demonstrate reduced impedance as a result of long-term exposure to external contaminants. As previously described herein, higher impedance values indicate lower susceptibility to corrosion.

Figure 3B:
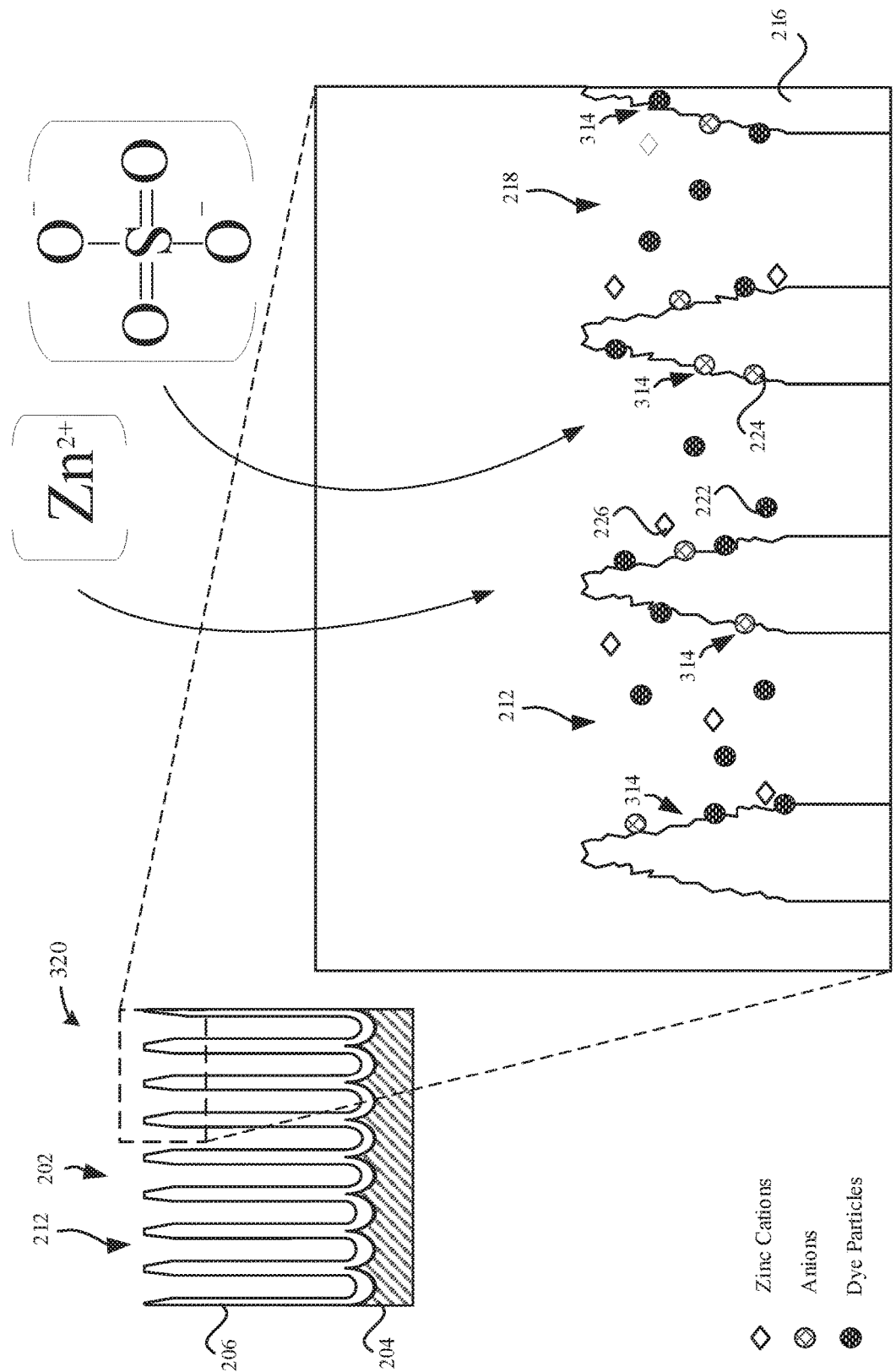

FIG. 3B illustrates a schematic diagram of a cross-sectional view of an anodized part 320 while absorbing dye particles, in accordance with some embodiments. In some examples, the anodized part 320 includes an anodized layer 206 that overlays a metal substrate 204. The anodized part 320 is exposed to a dye solution during the dyeing process. The dye solution may include dye particles 222, anions 224, and zinc cations 226. In particular, the dye particles 222 are capable of binding to sites 314 along pore walls 216 of the pore structures 212. However, as previously described herein, the dye solution also includes anions 224 (e.g. sulfate anions, etc.) that compete with the dye particles 222 for the sites 314. Beneficially, this competition for the sites 314 limits the number of sites 314 that are available to bind to and absorb the dye particles 222, thereby reducing uptake of the dye particles 222 in the pore structures 212. In some examples, these anions 224 may include at least one of acetates, oxalates, citrates, carbonates, or nitrates.

The pore walls 216 include multiple sites 314 that are capable of receiving the dye particles 222 and/or the anions 224. Additionally, it has been found that zinc cations 226 (relative to monovalent metal cations) included within the dye solution may further delay uptake of the dye particles 222 into the pore structures 212 relative to monovalent metal cations. Beneficially, the use of zinc cations 226 enables a smaller concentration of the inhibited anions 224 to be incorporated into the dye solution in order to yield equivalent dye results. As illustrated in FIG. 3B, zinc cations 226 become absorbed within the pore structures 212 during the dyeing process. It should be noted that as a result of the dyeing process, the zinc cations 226 are non-uniformly distributed throughout the pore structures 212. In some embodiments, the concentration of the divalent metal cations 226 is greater at the openings 218 of the pore structures 312 and the concentration tapers off towards the bottom surfaces of the pore structures 312.

Figure 3C:
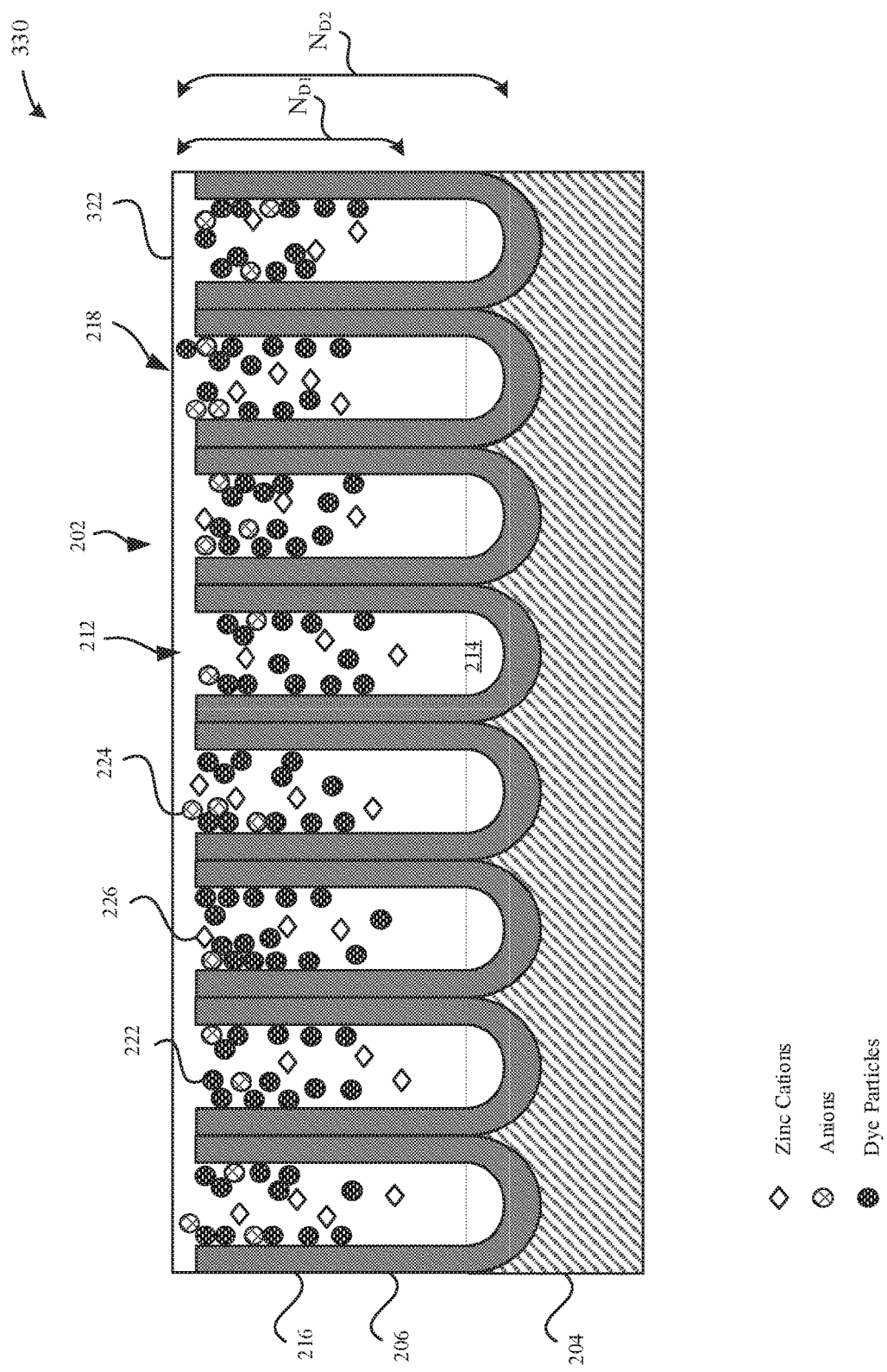

FIG. 3C illustrates a sealed dyed part 330, in accordance with some embodiments. In some examples, the sealed dyed part 330 corresponds to the dyed part 310 after undergoing a hydrothermal sealing process. During the hydrothermal sealing process, the dyed part 310 is exposed to a sealing solution so as to cause precipitation of hydrated aluminum oxide (e.g. boehmite, etc.). In particular, the hydrothermal sealing process causes swelling of the aluminum oxide of the anodized layer 206 while immersed in the sealing solution. The openings 218 to the pore structures 212 are closed off with a seal 322. Swelling of the aluminum oxide causes the openings 218 to narrow, thereby minimizing external elements from diffusing into the pore structures 212. Swelling of the openings 218 may also cause oxidized fragments or metal oxide material to be retained within the anodized layer 206. In particular, the alumina (of aluminum oxide) of the pore walls 216 is converted to aluminum oxide hydroxides (e.g. boehmite, diaspore, etc.) that results in swelling or volume increase of the oxide particles to partially close or partially seal the openings 218 of the pores 212. According to some examples, the sealed dyed part 310 is subjected to a sealing solution that includes immersion in a solution of 5% nickel acetate at 95° C. to 100° C. for 5-50 minutes.

The sealed dyed part 330 of FIG. 3C illustrates that the openings 218 of the pore structures 212 are sealed off with the seal 322 such as to prevent external contaminants from diffusing through the pore structures 212 to reach the metal substrate 204. However, it should be noted that the presence of monovalent ions, such as $Na^+$ incorporated from $Na_2SO_4$, within the pore structures 212 may compromise the long-term performance of the seal 322. In particular, as previously described herein, the monovalent ions deposited within pore structures 212 were measured to have lower impedance values relative to anodized layers that include zinc cations 226. For instance, higher impedance values indicate lower susceptibility to corrosion. When monovalent ions, such as sodium ($Na^+$) are present in the anodized layer 206, the overall impedance of the anodized layer 206 decreases, thereby reducing the resistance to corrosion-causing anions, such as chloride ($Cl^-$), which means there is greater susceptibility for these anions to pass through the anodized layer 206. In contrast, the presence of zinc cations 226 within the pore structures 212, such as zinc ($Zn^{2+}$), show increased impedance values.

In some embodiments, the zinc cations 226 progressively fills the pore structures 212 such that there is a divalent metal cation gradient throughout the thickness of the anodized layer 206. Since zinc has increased impedance properties relative to the metal oxide material, the anodized layer 206 is characterized as having an ionic conductivity and/or impedance gradient due to the gradient of zinc added therein. During the dyeing process, the zinc cations 226 may diffuse into the pore structures 212 and restrict the openings 218 of the pore structures 212, thereby preventing other divalent metal cations from diffusing any deeper into the pore structures 212. As such, the gradient corresponds to the concentration of the divalent metal cations 226 in the pore structures 212 drops sharply away from the external surface 202. For example, FIG. 3C illustrates that the pore structures 212 have a pore length of $N_{D2}$, and the zinc cations 226 have a penetration depth of Nm, where $N_{D2} > N_{D1}$. According to some examples, the anodized layer 206 includes between about 1 wt % to about 10 wt % of zinc cations 226. Moreover, it should be noted that these zinc cations 226 may be independent of any ions contributed by the metal substrate 204 during the anodization process.

In addition to impedance tests, as previously described herein, the integrity of the seal 322 of the sealed dyed part 330 may also be measured using electrochemical impedance spectroscopy (EIS). For example, a first EIS scan may be performed on pristine sealed dye part samples (i.e. no corrosion), followed by leaving these samples in a medium (e.g. 3.5 wt % NaCl at 30° C. for about 24 hours). Subsequently, a second EIS scan is performed on these samples. The magnitude of the reduction in impedance after the 24-hour immersion period is a measure of these samples' susceptibility to corrosion in the medium. It should be noted that dyed sealed parts that utilize monovalent cations (e.g. sodium, etc.) demonstrated about a 50% degradation in seal 322 performance subsequent the impedance tests.

Figure 4A:
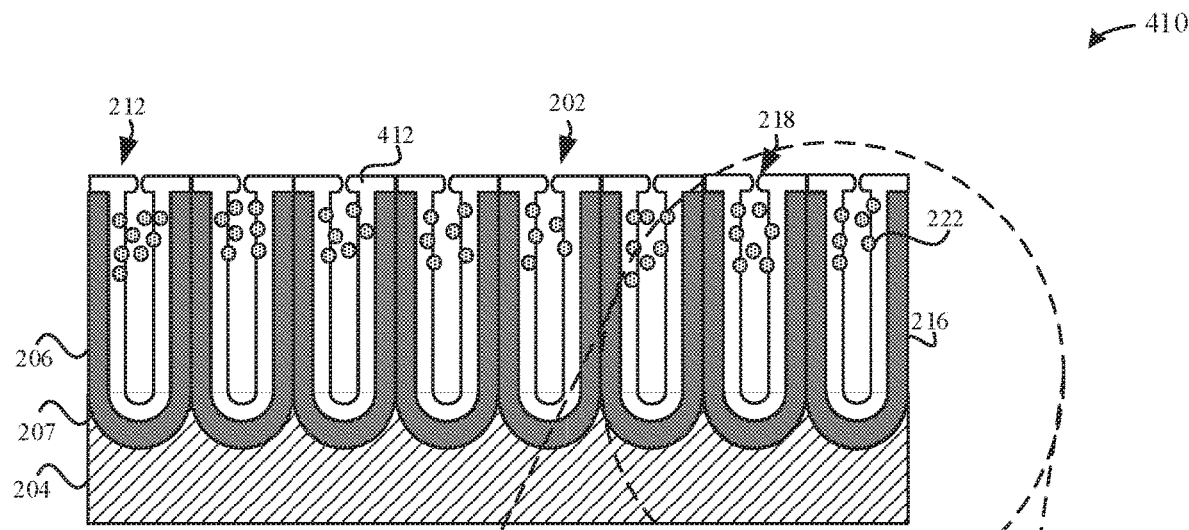

FIG. 4A illustrates a partially-sealed part 410 while undergoing a hydrothermal sealing process, in accordance with some embodiments. In some examples, the partially-sealed part 410 represents the dyed part 310 during the hydrothermal sealing process. Although FIG. 4A illustrates dye particles 222 included within the pore structures 212 of the partially-sealed part 410, it should be noted that the dyeing process is optional, and the sealing process may also be performed on the anodized part 210, which is not dyed. According to some examples, the partially-sealed part 410 may correspond to the dyed part 310 that is exposed to the hydrothermal sealing process.

The hydrothermal sealing process involves hydrating the amorphous alumina surfaces of the pore walls 216 to a gel of boehmite ($Al_2O_3.H_2O$) and/or bayerite ($Al_2O_3.3H_2O$) such that the amorphous aluminum material swells and closes the openings 218 of the pore structures 212. The sealing process may be enhanced by using zinc acetate, together with acetic acid, which additionally precipitates metal hydroxides in the pore structures 212 and accelerates the sealing process. In some examples, the hydrothermal sealing process may be performed in steam, hot water (e.g. at or near boiling temperature so as to reduce smutting), or at a temperature as low as about 70° C. The hydrothermal sealing process causes precipitation of hydrated aluminum oxide (e.g. boehmite, etc.). In particular, the hydrothermal sealing process causes swelling of the aluminum oxide of the anodized layer 206 while immersed in the sealing solution. Swelling of the aluminum oxide causes the openings 218 to narrow, thereby minimizing external elements from diffusing into the pore structures 212. Swelling of the openings 218 may also cause oxidized fragments or metal oxide material to be retained within the anodized layer 206. During the hydrothermal sealing process, the alumina (of aluminum oxide) is converted to a hydrated material 412, such as aluminum oxide hydroxides (e.g. boehmite, diaspore, etc.) that results in swelling or volume increase of the oxide surfaces to partially close or partially seal the openings 218 of the pore structures 212. In some examples, the hydrated material 412 uniformly lines the pore walls 216 of the pore structures 212. The hydrated material 412 may refer to generally insoluble hydroxide material.

It should be noted that the sealing process locks the dye particles 222 into the pore structures 212, and protects the pore structures 212 from stains, dirt, external contaminants, and the like. The hydrothermal sealing process may lock the color from the dyeing process without any further changes. Indeed, locking the dye color within the pore structures 212 is important in the consumer electronics industry where uniform color between many dyed parts and an overall, uniform cosmetic appearance of metallic surfaces is highly valued in attracting consumers.

It should be noted that it is possible for the sealing process to cause further color changes, such as from bleeding of the dye particles 222 into the sealing bath having the sealing solution. This color change may be quantified using a reflectance spectrophotometer that quantifies the color according to a CIE L*a*b* color standard that compares the change in color dE94 before and after the sealing process.

Figure 4B:
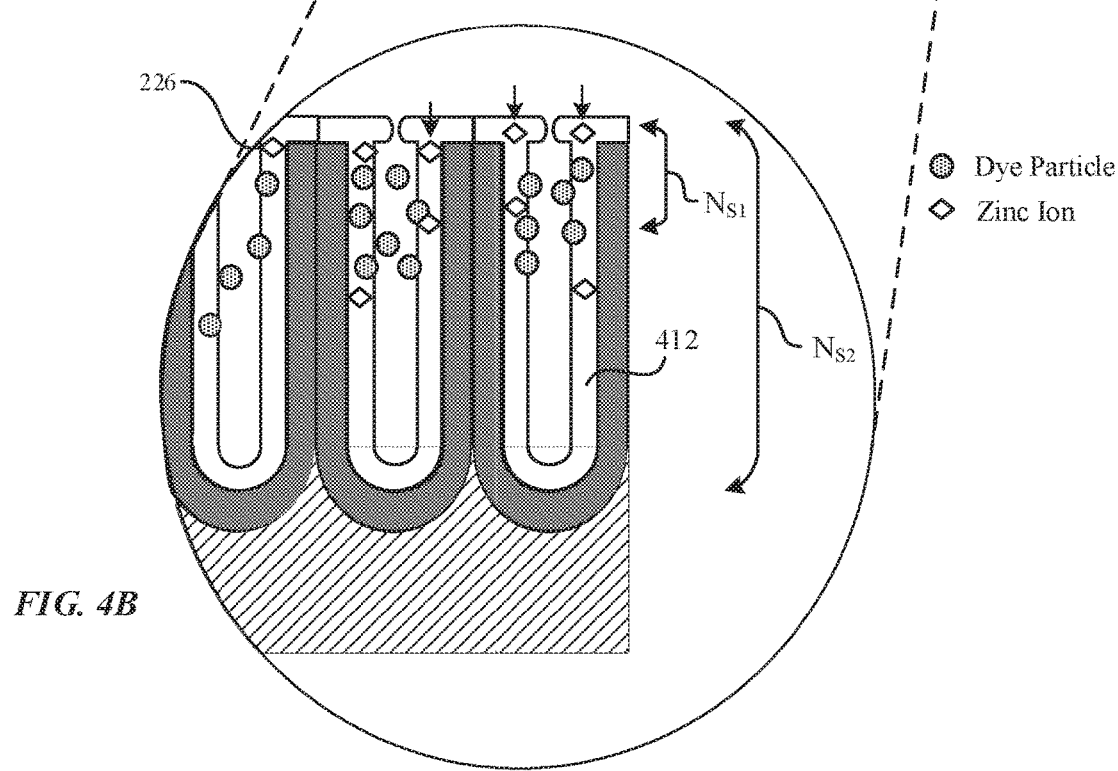

FIG. 4B illustrates a magnified cross-sectional view of the partially-sealed part 410, in accordance with some embodiments. According to some embodiments, and as illustrated in FIG. 4B, the sealing solution includes zinc acetate which additionally precipitates metal hydroxides in the pore structures 212 and accelerates the sealing process. For example, a similar seal performance to that achieved by immersion in boiling water or exposure to steam for about five minutes is achieved within about 30 seconds using zinc acetate. Indeed, the presence of zinc in the zinc acetate sealing solution may catalyze the hydration reaction. Moreover, zinc is also incorporated into the hydrated material 412, such as in the form of an amorphous oxide/hydroxide pore seal. In particular, zinc may be incorporated as zinc hydroxide, zinc oxyhydroxide or zinc oxide. The hydrated material 412 that includes zinc may further plug the openings 218 of the pore structures 212, thereby leading to retention of the dye particles 222 within the pore structures 212. Beneficially, zinc acetate renders the hydrothermal sealing process less acutely sensitive to contamination (e.g. sulfates, phosphates, silicates, chlorides, etc.), to pH fluctuations, and to temperature fluctuations. Furthermore, zinc hydroxide has lower water solubility than nickel hydroxide, which is more beneficial for sealing the pore structures 212.

According to some examples, the sealing solution includes zinc acetate at a concentration of between about 1 g/L to about 10 g/L. In some examples, the sealing solution includes zinc acetate at a concentration of 7 g/L. In some examples, the pH of the sealing solution is 5.5+/−0.5 using acetic acid. A surfactant (e.g. naphthalene sulfonic acid (NSA) or ethylenediaminetetraacetic acid (EDTA), etc.) is added at a concentration of 1-3 g/L. In some examples, the dyed part 310 and/or the anodized part 210 is exposed to the sealing solution for at least 20 seconds. In some examples, the sealing exposure time is between 15 minutes and about 60 minutes. In other examples, the sealing exposure time is between about 1-2 minutes. The sealing solution may also include chelating agents, and may also include pH stabilizers, and "anti-smutting" additives.

As illustrated in FIG. 4B, the hydrated material 412 that lines the pore walls 216 includes zinc cations 226 from the sealing solution (e.g. zinc acetate, etc.). The zinc cations 226 diffuse into the pore structures 212 from the sealing solution. As illustrated in FIG. 4B, although the hydrated material 412 may uniformly line the pore walls 216, the zinc cations 226 may also be randomly distributed throughout the hydrated material 412 that fills the pore structures 212. In some embodiments, the zinc cations 226 may be uniformly dispersed throughout the pore structures 212 to cover generally all of a thickness of the anodized layer 20. In some embodiments, the zinc cations 226 from the sealing solution show a continuous increase in concentration from the metal substrate/anodized layer interface 207 and towards the external surface 202 of the anodized layer 206. In other words, the concentration of zinc contributed from the sealing solution is greatest at the external surface 202. Indeed, during the hydrothermal sealing process, the zinc cations 226 that diffuse into the pore structures 212 may block or prevent other zinc cations 226 from diffusing any deeper into the pore structures 212. As such, the concentration of zinc in the pore structures 212 drops sharply away from the external surface 202. For example, FIG. 4B illustrates that the pore structures 212 have a pore length of NS2, and the presence of zinc cations 226 has a penetration depth of NS1, where NS2>NS1.

FIG. 4C illustrates a sealed part 420 subsequent to the hydrothermal sealing process, in accordance with some embodiments. Although FIG. 4C illustrates dye particles 222 included within the pore structures 212, it should be noted that the dyeing process is optional, and the sealing process may also be performed on the non-dyed anodized part 210. In contrast to the partially-sealed part 410, the openings 218 of the pore structures 212 of the sealed part 240 are fully sealed with the seal 414 so as to prevent the dye particles 222 from leaching out of the pore structures 212. The seal 414 includes hydrated material 412 (e.g. aluminum oxide hydroxides, etc.). In particular, the aluminum oxide hydroxides include boehmite, diaspore, and the like. In some examples, the aluminum oxide hydroxides has a greater volume than the aluminum oxide. The hydrated material 412 may make up the seal 414 that seals in the openings 218 of the pore structures 212. According to some embodiments, the sealed part 420 includes uniform levels of hydrated material 412 along the pore walls 216 of the pore structures 212. In some examples, the hydrated material 412 forms the seal 414 that generally corresponds to the external surface 202 of the anodized part 210.

FIG. 4D illustrates a magnified cross-sectional view of the sealed part 420, in accordance with some embodiments. In particular, FIG. 4D illustrates that the concentration of zinc cations 226 present in the anodized layer 206 is greatest towards the external surface 202. As illustrated in FIG. 4D, the concentration of the zinc cations 226 is greater at the openings 218 of the pore structures 212 and the concentration of the zinc cations 226 tapers off towards the bottom surfaces 214 of the pore structures 212. In some examples, the sealed part 420 may have a surface concentration at the external surface 202 of the anodized layer 206 between about 3 wt % to about 7 wt % of zinc. In some embodiments, the zinc cations 226 of the hydrated material 412 progressively fills the pore structures 212 such that there is a zinc gradient throughout the thickness of the anodized layer 206. Since the zinc-enhanced seal (e.g. aluminum oxide hydroxide with zinc or zinc hydroxide incorporated) has increased impedance properties relative to the aluminum oxide material, the anodized layer 206 is characterized as having an ionic conductivity and/or impedance gradient due to the gradient of zinc added therein.

Moreover, it should be noted that the concentration of zinc included within the anodized layer 206 that is contributed by a zinc-based sealing solution may be generally independent of the chemistry of the dye solution. Indeed, very few organic dyes include zinc. Moreover, those few organic dyes that include zinc results in less than 1 wt % of zinc incorporated into the sealed anodized layer, even when dyed to saturation. Thus, the concentration of zinc that is included within the anodized layer that is contributed by zinc-based dyes is less than 1 wt %. In other words, the external surface concentration of zinc between about 3 wt % to about 7 wt % of zinc would not be attributed in the majority to use of zinc-based dyes.

Surprisingly, when zinc acetate is used in an otherwise direct substitution for nickel acetate as a sealing solution, there is a greater concentration of zinc cations 226 in the pore structures 212 and a deeper penetration of the zinc cations 226 into the pore structures 212 than nickel ions. Furthermore, with reference to FIG. 4D, zinc cations 226 show a more progressive drop-off in concentration throughout the length of the pore structures 212 than nickel ions. For instance, as will be described in greater detail with reference to FIG. 14A-14B, if the anodized layer 206 has a thickness of 12 micrometers, then anodized parts using zinc-based seals will demonstrate between about 1 wt %-2 wt % of zinc even at a thickness of 6 micrometers (or 50% of the thickness of the metal oxide layer). In contrast, anodized parts using nickel-based seals will demonstrate about 0 wt % of nickel at a thickness of 6 micrometers. This unexpected result shows deeper penetration of zinc cations 226 than nickel ions into the pore structures 212. Moreover, this demonstrates a sharper drop-off of the concentration of nickel ions present in the anodized layer 206. Since the zinc cations 226 penetrate deeper into the pore structures, the anodized layer 206 is associated with reduced admittance and reduced ionic conductivity relative to the nickel-based seals. Beneficially, zinc-based seals will result in better corrosion resistance and better ultraviolet (UV) light radiation attenuation. FIG. 4D illustrates that the concentration of zinc cations 226 in the pore structures 212 drops sharply away from the external surface 202. For example, FIG. 4D illustrates that the pore structures 212 have a pore length of $N_{S2}$, and the presence of zinc cations 226 has a penetration depth of $N_{S1}$, where $N_{S2} > N_{S1}$.

FIG. 4E illustrates a magnified cross-sectional view of the sealed part 420, in accordance with some embodiments. In particular, FIG. 4E illustrates that the concentration of zinc cations 226 within the pore structures 212 is generally elevated and uniform throughout the thickness of the anodized layer 206. Beneficially, the use of zinc-based seals may be able to enable more uniform/generally uniform penetration of the zinc cations 226 of the hydrated material 412 within the pore structures 212, thereby providing generally uniform corrosion resistance throughout the anodized layer 206, greater and more uniform UV radiation attenuation throughout the anodized layer 206, and the like. The elevated and generally uniform concentration of zinc cations 226 and its benefits are unexpected and in sharp contrast to nickel acetate-based seals. The term generally uniform penetration may be defined as a generally uniform concentration of the zinc cations 226 throughout the thickness of the anodized layer 206. FIG. 4E illustrates that the concentration of zinc cations 226 has a penetration depth of $N_{S3}$, where $N_{S2} = N_{S3}$.

In some examples, it should be noted that if zinc acetate is used as the sealing solution, then there should be an absence of nickel ions (or general absence of nickel ions) present at the external surface 202 of the anodized layer 206, as indicated by FIG. 4E. Furthermore, it should be noted that if the metal substrate 204 includes zinc (i.e. zinc-based alloy), and a zinc-based sealing solution is used to seal the pore structures 212 of the anodized layer 206, then the zinc ions from the metal substrate 204 may be incorporated into the aluminum oxide material of the pore walls 216. However, the zinc ions from the metal substrate 204 do not contribute to the concentration of zinc ions that are included in the hydrated material 412 that fills the pore structures 212. Furthermore, it should be noted that the concentration of zinc cations 226 included in the anodized layer 206 is minimally affected regardless of the concentration of zinc present in the metal substrate 204. For example, if the metal substrate 204 includes 5.5% zinc, the maximum concentration of zinc as measured at the external surface 202 would be about 1 wt %.

In other examples, if the metal substrate 204 includes nickel (e.g. nickel aluminide, etc.), but utilizes a zinc-based sealing solution to seal in the pore structures 212 of the anodized layer, then the nickel ions from the metal substrate 204 do not make up the chemical structure of the hydrated material 412 that fills in the pore structures and seals the openings 218. Instead the nickel ions may only diffuse into the aluminum oxide material that constitutes the pore walls 216 of the anodized layer 206.

Figure 5:
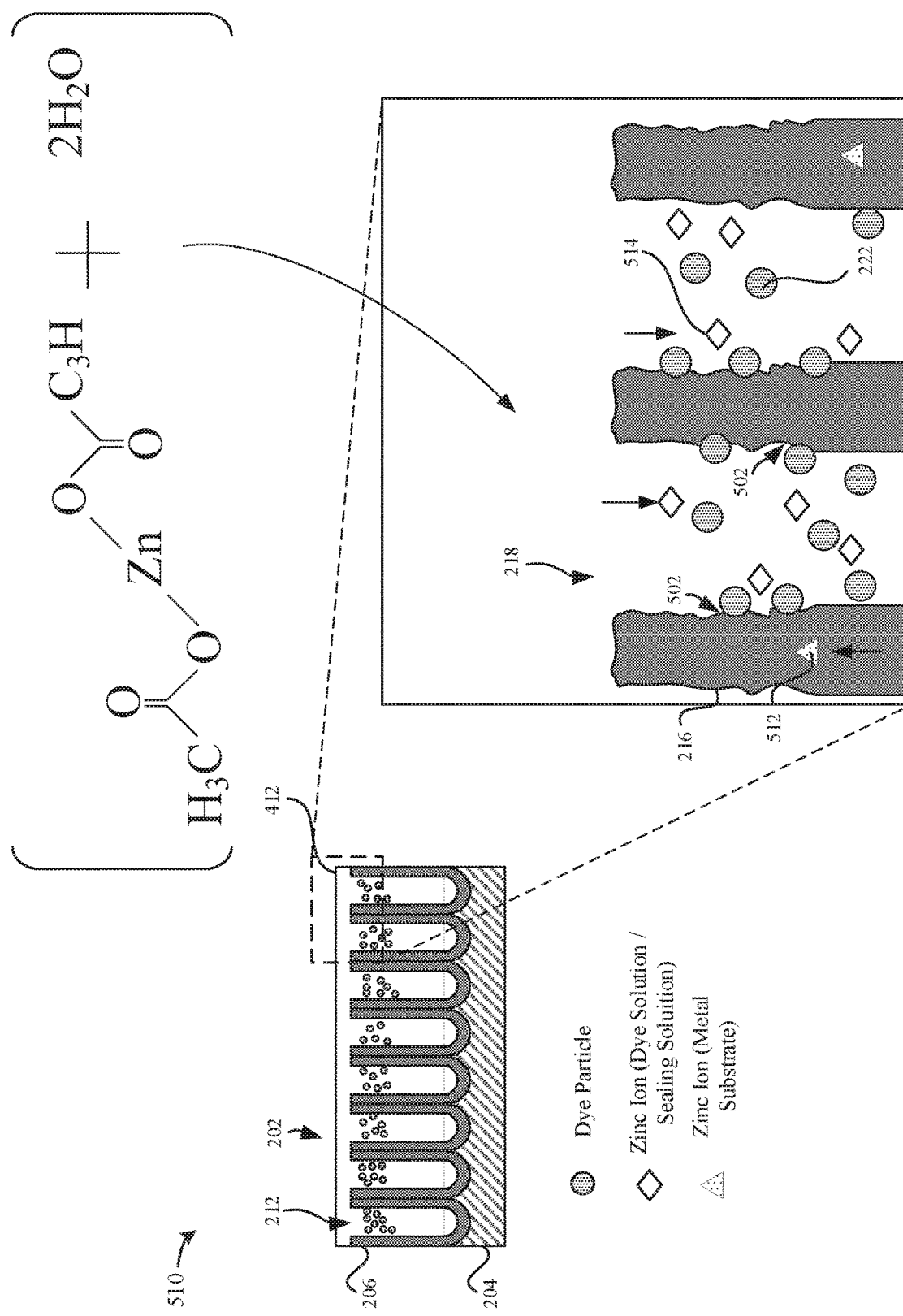
FIG. 5 illustrates a schematic diagram of a cross-sectional view of a process for incorporating zinc ions into an anodized substrate, in accordance with some embodiments.

FIG. 5 illustrates a schematic diagram of a cross-sectional view of a sealed dyed part 510 subsequent to a hydrothermal sealing process, in accordance with some embodiments. In particular, the sealed dyed part 510 is shown as having a metal substrate 204 that includes zinc (i.e. zinc-based alloy). For example, during the anodization process, metal substrate-derived zinc ions 512 from the metal substrate 204 diffuse into the anodized layer 206. However, the external surface concentration of zinc is minimally affected by the contribution of the metal substrate-derived zinc ions 512. In some examples, the metal substrate 204 contributes ≤1 wt % of zinc measured at the external surface 202. Furthermore, it should be noted that the elemental profile of the metal substrate-derived zinc ions 512 is relatively flat or even declines towards the external surface 202.

As illustrated in FIG. 5, the dye particles 222 are bound to binding sites 502 of the pore walls 216 as a result of an optional dyeing process that is performed prior to the hydrothermal sealing process. As illustrated in FIG. 5, the sealed dyed part 510 is exposed to a sealing solution that includes zinc salt, such as zinc acetate. In some examples, the zinc acetate is used at a concentration of between 1 g/L to 10 g/L of the sealing solution. The acetate anions from the zinc acetate solution may diffuse into the pore structures 212. In some examples, the acetate anions included within the pore structures 212 may be detected by using ion chromatography on a sample of pure de-ionized water, to which ~30 wt % of nitric acid is added, where the sealed dyed part 510 is immersed for between about 12-24 hours. This detection method is in contrast to what it utilized to detect the concentration of zinc that constitutes the aluminum oxide material of the pore walls 216.

The anodized layer 206 may include zinc ions 514 that penetrate the pore structures 212, where the zinc ions 514 are derived from at least one of the zinc acetate sealing solution, the zinc-based dye solution or a zinc-based buffer solution. In one example, subsequent to the anodization process, the electrolytic anodizing solution may be rinsed off with deionized water and a buffer that includes between about 1 g/1-20 g/l of zinc acetate. As a result, zinc ions 514 from the buffer may diffuse into the pore structures 212 via the openings 218. In another example, the dye solution may include a source of zinc ions 514, such as zinc sulfate (e.g. ZnSO$_4$), which may be absorbed into the pore structures 212 during the dyeing process. Additionally, the dyeing process may be controlled with 1 g/l of zinc sulfate in combination with any of the techniques described herein. In another example, subsequent to the dyeing process, the dye solution, which may not necessarily include zinc ions, may be rinsed with deionized water and a zinc-based buffer solution that includes between about 1 g/1-20 g/l of zinc acetate. In yet another example, the sealing solution may include between about 1 g/1-20 g/l of zinc acetate. During the sealing process, zinc ions 514 from the sealing solution diffuse into the pore structures 212 via the openings 218.

In some embodiments, the surface concentration of zinc at the anodized layer 206 is between about 3 wt % to about 7 wt % of zinc. However, it should be noted that the metal substrate-derived ions 512 contribute at most about 1 wt % of the surface concentration of zinc at the anodized layer 206. Furthermore, the metal substrate-derived ions 512 are disposed and contained within the pore walls 216 instead of within the pore structures 212. In some embodiments, if the sealed dyed part 510 is dyed with a zinc-based dye solution and then subsequently sealed with a zinc-based sealing solution, it should be noted that if the dye particles 222 are zinc-based, these zinc-based dye particles 222 contribute less than 1 wt % to the surface concentration. In some embodiments, a majority of the surface concentration of zinc may be attributed to the zinc-based sealing solution.

Furthermore, the distribution of the zinc ions 514 within the pore structures 212 should be contrasted with the distribution of metal substrate-derived zinc ions 512 within the pore structures 212. In particular, with reference to FIG. 5, the non-uniform distribution of the zinc ions 514 within the pore structures 212 exemplifies that these zinc ions 514 may originate from at least one of a zinc-based dye solution, a zinc-based sealing solution or a zinc-based buffer. In contrast, metal substrate-derived zinc ions 512 are generally uniformly distributed throughout the pore structures 212.

Furthermore, the metal substrate-derived zinc ions 512 will have a negligible effect on the surface concentration of zinc at the anodized layer 206. For example, if the metal substrate 204 includes 5.5% zinc, there would be a maximum surface concentration of 1% of zinc incorporated into the anodized layer 206 from the metal substrate 204 as a result. Furthermore, the concentration of zinc originating from the metal substrate 204 would be greater at the lower surface of the anodized layer 206 (i.e. that is adjacent to the barrier layer) before dropping off significantly towards the external surface 202 of the dyed part 310. In some embodiments, the zinc ions 514 progressively fills the pore structures 212 such that there is a zinc gradient throughout the thickness of the anodized layer 206. Since a zinc-augmented seal has increased impedance properties relative to the aluminum oxide material, the anodized layer 206 is characterized as having an ionic conductivity and/or impedance gradient due to the gradient of zinc added therein.

Figure 6:
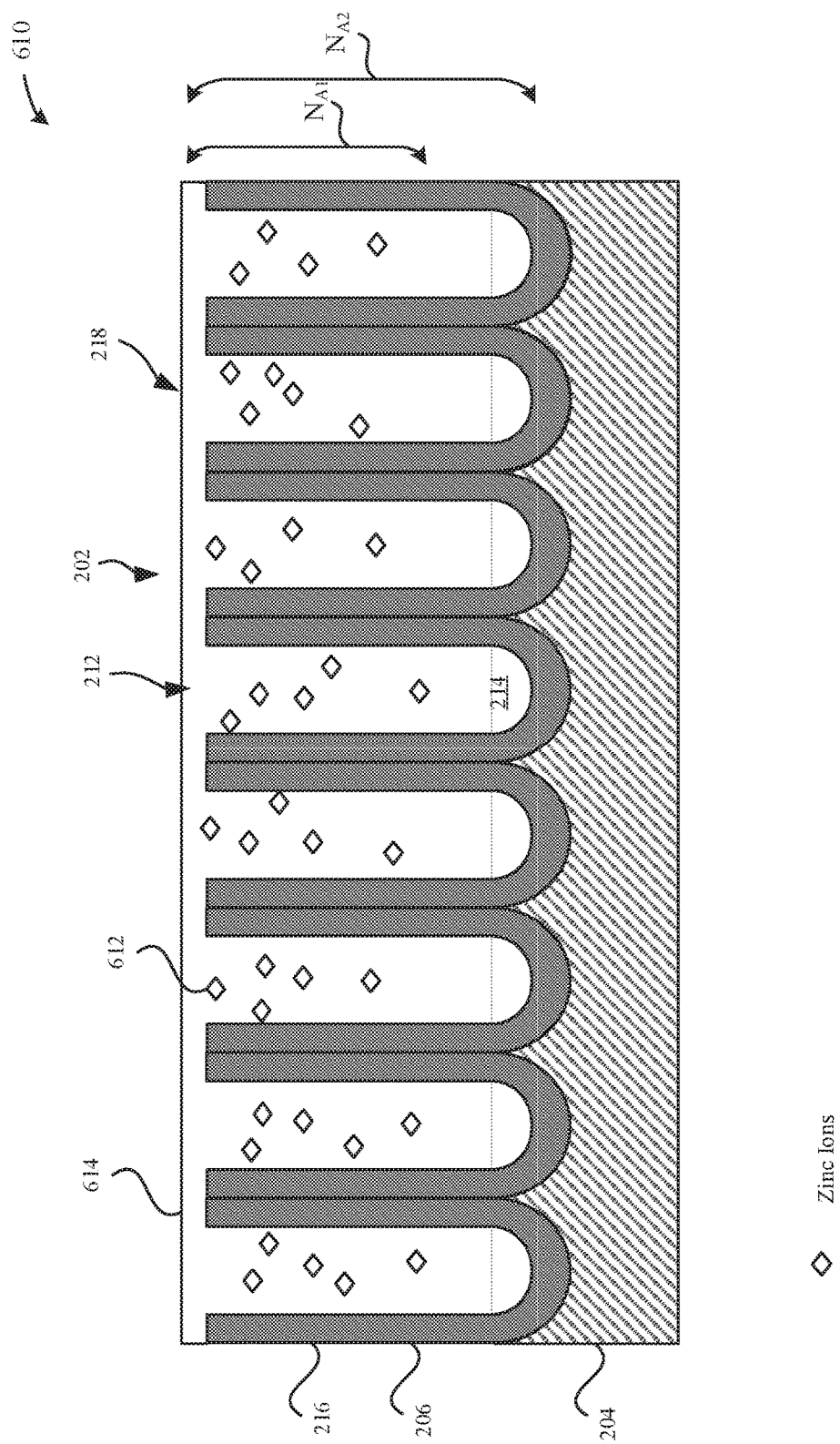
FIG. 6 illustrates a cross-sectional view of a process for incorporating zinc ions into an anodized substrate, in accordance with some embodiments.

FIG. 6 illustrates a cross-sectional view of a sealed anodized part 610, in accordance with some embodiments. As illustrated in FIG. 6, the sealed anodized part 610 was not previously dyed, and therefore does not include dye particles. Instead the sealed anodized part 610 includes zinc ions 612 that may originate from at least one of a zinc-based sealing solution or a zinc-based buffer solution. Furthermore, it may be inferred from FIG. 6 that the zinc ions 612 do not originate from the metal substrate 204 because the zinc ions 612 are non-uniformly distributed throughout the pore structures 212. As illustrated in FIG. 6, the concentration of zinc ions 612 present in the anodized layer 206 is greatest towards the external surface 202. The concentration of the zinc ions 612 is greater at the openings 218 of the pore structures 212 and the concentration of the zinc ions 612 tapers off towards the bottom surfaces 214 of the pore structures 212. For example, FIG. 6 illustrates that the pore structures 212 have a pore length of $N_{42}$, and the presence of zinc ions 612 has a penetration depth of $N_{41}$, where $N_{42} > N_{41}$. In some examples, the sealed anodized part 610 may have a surface concentration at the external surface 202 of the anodized layer 206 between about 3 wt % to about 7 wt % of zinc. The zinc ions 612 that are incorporated into the pore structures 212 may be in the form of a hydrated zinc material, such as zinc oxide, zinc hydroxide or zinc oxyhydroxide that comprises the seal 614 that plugs the pore structures 212.

Many consumer portable electronic devices that are dyed various colors are exposed to environmental conditions that include light (e.g. UV light, etc.). However, the organic dye particles that make up the dye colors are susceptible to degradation when exposed to UV light. In particular, organic dye particles may degrade when exposed to UV light. It should be noted that conventional anodized layers that are sealed with sealants such as nickel acetate may not sufficiently protect against color degradation. This may be attributed, at least in part, to nickel being a weak absorber of UV light.

With reference to the various anodized parts illustrated with reference to FIGS. 3-6 that incorporate zinc ions, the anodized layers that incorporate a sufficient amount of zinc ions (e.g. at least 1 wt %) demonstrate significantly better retention of dye colors than anodized layers that include nickel ions for several reasons.

Firstly, zinc compounds absorb a broader spectrum of UV light than nickel compounds. In some examples, the zinc ions 612 that are disposed throughout the pore structures 212 and/or the anodized layer 206 that comprise the seal—e.g. the seal 614—may be referred to as inorganic compounds. As described herein, the zinc ions 612 may be heavily concentrated at regions of the anodized layer 206 correspond to the external surface 202. When visible light is incident upon the external surface 202 of the anodized layer 206, the zinc ions 612 disposed within the anodized layer 206 as zinc oxide and/or zinc hydroxide may absorb generally all of the UV light that is 380 nm or less. UV light may include UVA light (~320-400 nm) and UVB light (~280-320 nm). In other words, the zinc compounds absorb the entire UVB range and almost entirely the entire UVA range. In contrast, nickel compounds weakly absorb UV light. Accordingly, an anodized layer 206 that includes zinc compounds will more strongly attenuate UV light than nickel compounds, thereby benefiting anodized parts that include substantial and detectable amounts of zinc compounds (e.g. greater than 2 wt %).

Secondly, zinc ions penetrate more deeply than nickel ions into pore structures 212 such that there is a broader coverage of zinc ions present in the pore structures 212. Indeed, the presence of the zinc ions more closely corresponds to the range of dye particles that are present in the pore structures 212. For example, subsequent to the dye process, the dye particles may penetrate to a depth of at least 2 micrometers or greater from the external surface 202 of the anodized layer 206. In contrast, nickel ions may seldom reach a depth of 2 micrometers from the external surface 202. Accordingly, the depth of penetration of the zinc ions more closely corresponds to regions of the anodized layer 206 where the dye particles are most heavily concentrated and where the intensity of UV radiation is greatest (least attenuation).

Thirdly, attributed at least in part to the greater penetration of zinc ions in the pore structures 212, there is a greater concentration of zinc ions present in the anodized layer 206 than nickel ions. To illustrate this point, as will be described in greater detail with reference to FIG. 14A-14B, if the anodized layer 206 has a thickness of 12 micrometers, then anodized parts using zinc-based seals will demonstrate between about 1 wt %-2 wt % of zinc even at a thickness of 6 micrometers (or 50% of the thickness of the metal oxide layer). In contrast, anodized parts using nickel-based seals exhibit about 0 wt % of nickel at a thickness of 6 micrometers.

Fourth, zinc oxide compounds have a size that is sufficient to impart a physical seal plug for the pore structures 212. In some examples, zinc oxide compounds have a particle size between about 10-100 nm. In contrast, when using a nickel-based seal, little or no UV protection of the dye particles results because nickel compounds poorly attenuate UV light.

In some embodiments, it may be preferable to incorporate the zinc ions through a zinc—based sealing solution. As the sealant is an inorganic compound, the UV light does not affect the seal. Thus, the seal that includes hydrated zinc may function as a physical plug that drastically minimizes the dye particles exposure to UV light. It should be further noted that the described benefits may also be derived from incorporating zinc ions into the anodized layer 206 via at least one of the dyeing process or a rinsing process.

Figure 7:
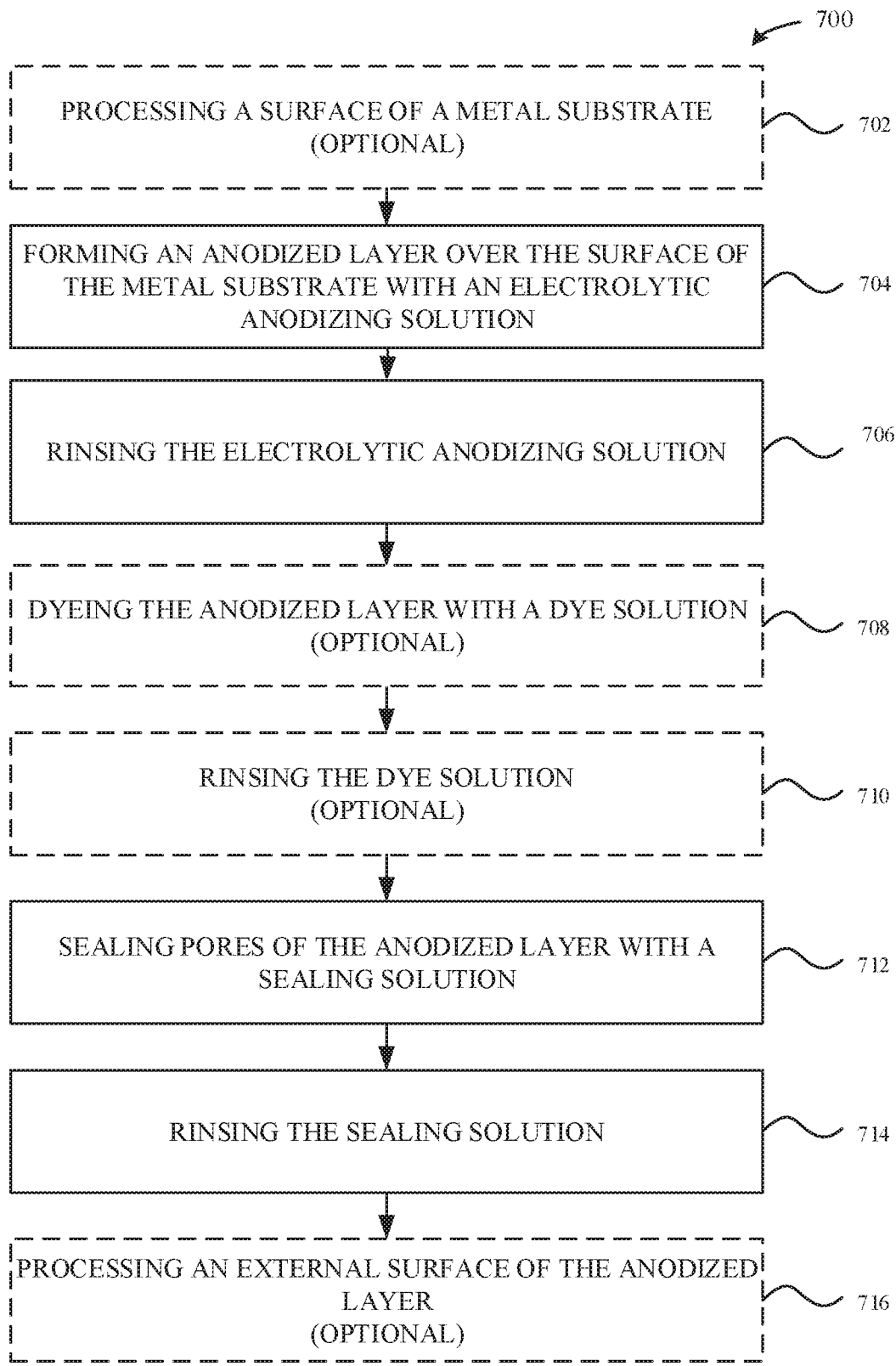
FIG. 7 illustrates a method for incorporating zinc ions into an anodized substrate, in accordance with some embodiments.

FIG. 7 illustrates a method 700 for incorporating zinc ions into an anodized layer, in accordance with some embodiments. As illustrated in FIG. 7, the method 700 optionally begins at step 702, where a surface of a part—e.g. a metal substrate 204—is optionally processed. In some examples, the surface of the metal substrate 204 is subject to a cleaning process, a texturizing process, a buffing process, or a polishing process. In particular, the texturizing process can be beneficial in providing a roughened external surface that can promote growth of the anodized layer 206 at those roughened regions.

At step 704, an anodization step is performed on the metal substrate 204. During the anodization process, the anodized layer 206 is formed from the metal substrate 204. In some examples, the anodized layer 206 may be formed through exposure to a thermal oxidation process or an electrolytic anodizing solution.

At step 706, the electrolytic anodizing solution may be rinsed off the external surface 202 of the anodized layer 206 with deionized water and a buffer solution. The deionized water functions to stop the chemical reaction(s) associated with the anodization process. In some examples, the buffer solution may include between about 1 g/l to about 20 g/l of zinc acetate. The zinc acetate may be a source of zinc ions that may be incorporated into the anodized layer 206 subsequent to the rinsing process.

At step 708, the anodized layer 206 is optionally colored as a result of a dyeing process. During the dyeing process, the anodized part—e.g. the anodized part 210—is exposed to a dye solution bath. The anodized part 210 is submerged within the dye solution bath to yield the dyed part 310. The dye solution may be buffered with between about 1 g/l to about 20 g/l of zinc acetate together with acetic acid and/or controlled with about 1 g/l of zinc sulfate. Beneficially, the zinc sulfate may reduce the uptake of the dye particles into the anodized layer 206, thereby promoting greater dye uniformity across multiple batches of the anodized part 210 when compared to a dye solution buffered with sodium sulfate especially where light shades of color with low concentration of dye uptake are being targeted. The zinc acetate and/or zinc sulfate may be a source of zinc ions that may be incorporated into the anodized layer 206 subsequent to the dyeing process.

At step 710, the dye solution may be rinsed off the external surface 202 of the anodized layer 206 with deionized water and a buffer solution. The deionized water functions to stop the chemical reaction(s) associated with the dyeing process as well as to stabilize the pH value of the dye. In some examples, the buffer solution may include between about 1 g/l to about 20 g/l of zinc acetate. The zinc acetate may be a source of zinc ions that may be incorporated into the anodized layer 206 subsequent to the dyeing process.

At step 712, the pore structures 212 of the anodized layer 206 are sealed via a sealing process according to some embodiments. In some instances, sealing the pore structures 212 may be preferable in that sealing closes the pore structures 212 such that dye particles 222 are retained within the anodized layer 206. The sealing process includes exposing the anodized part 210 and/or dyed part 310 to a sealing solution. The sealing solution may include zinc salt (e.g. zinc acetate, etc.). The zinc acetate may be a source of zinc ions that may be incorporated into the anodized layer 206 subsequent to the sealing process. The zinc acetate has a concentration of between 1 g/L to 10 g/L. In some examples, the zinc acetate is used at a concentration of 7 g/L. In some examples, the dyed part 310 and/or the anodized part 210 is exposed to a sealing solution having a temperature >80° C. The solution has a conductivity of less than 200 microSiemens/cm. The pH of the solution is 5.5+/−0.5 using acetic acid. A surfactant (e.g. naphthalene sulfonic acid (NSA) or ethylenediaminetetraacetic acid (EDTA), etc.) is added at a concentration of 1-3 g/L. In some examples, the dyed part 310 and/or the anodized part 210 is exposed to the sealing solution for at least 20 seconds. In some examples, the sealing exposure time is between 15-60 minutes to achieve a thorough seal for anodized layer 206 having a thickness between about 15-20 micrometers. In other embodiments, the sealing exposure time is between about 1-2 minutes to retain dye particles and block the openings 218 of the pore structures 212, but leave the bulk of the metal oxide thickness only partially sealed, and therefore, more mechanically compliant. In some examples, the sealing solution is maintained at 98° C.+/−2° C. and is continuously recirculated through a 10 micron filter and agitated with filtered air. Beneficially, the zinc-based sealing solution forms a physical plug that fills the pore structures 212 within a few seconds of immersion, which means that precisely tuned colors of dyes exhibit little to no change in color during the sealing process.

At step 714, the sealing solution may be rinsed off the external surface 202 of the anodized layer 206 with deionized water and subsequently dried off.

At step 716, the external surface 202 of the anodized layer 206 of the sealed part 420 may be processed. For example, the anodized layer 206 may be subject to a surface polishing, texturizing, and the like. It should be noted that one or more of the steps described herein may be performed in combination with other techniques so as to incorporate zinc ions into the anodized layer 206. For example, a dye solution that is buffered with zinc acetate for incorporating zinc ions into the anodized layer 206 may be used in combination with a nickel acetate sealing solution.

Figure 8:
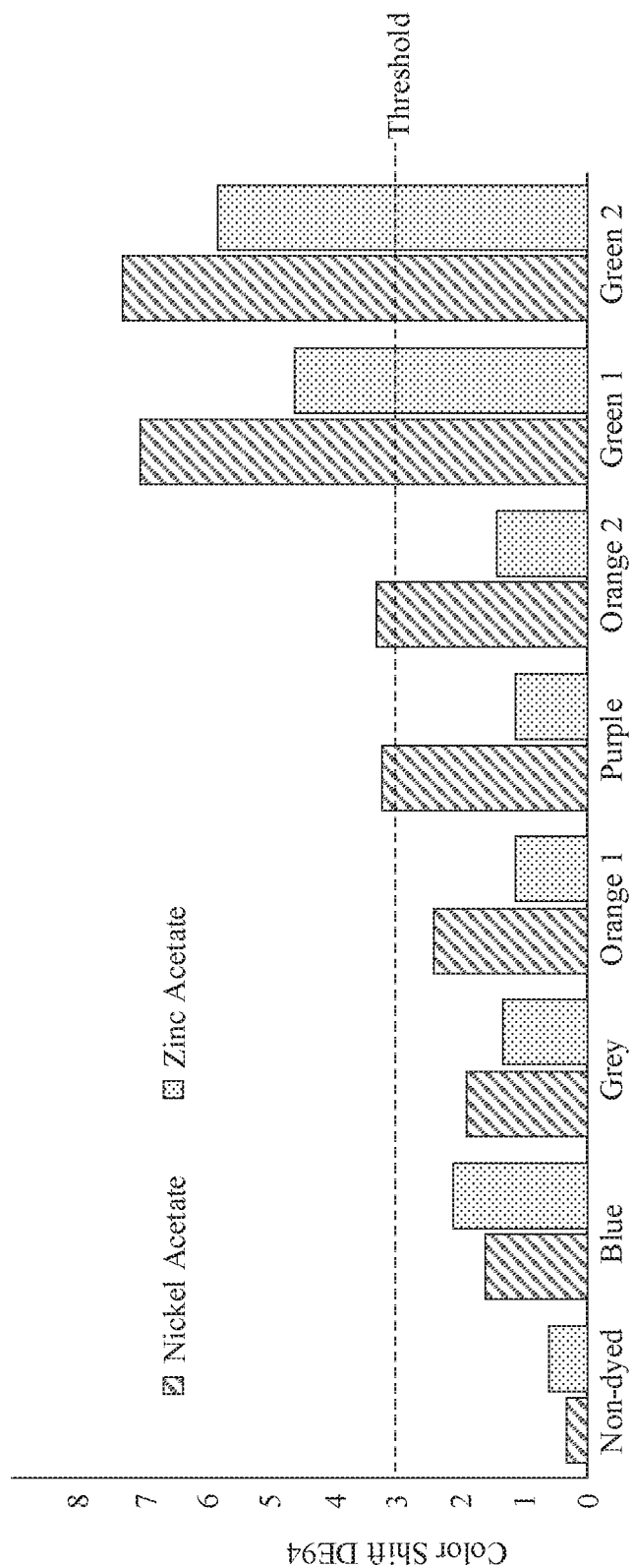
FIG. 8 illustrates an exemplary graph indicating color shift as a relationship of light exposure time in anodized substrates, in accordance with some embodiments.

FIG. 8 illustrates an exemplary graph indicating a relationship of CIE dE94 color change as a function of a type of seal chemistry subsequent to ultraviolet light exposure, in accordance with some embodiments. Anodized parts may be dyed a variety of different colors through organic dyes. Beneficially, the incorporation of zinc between e.g. 3 wt % to about 10 wt % increases the amount of color stability of the dyed anodized parts, thereby broadening the range of dye colors which satisfy a specific threshold for solar exposure performance. For example, consumer portable electronic devices may require a resistance to color degradation.

According to the exemplary trials illustrated in FIG. 8, anodized parts were dyed various colors and sealed using nickel acetate or zinc acetate. Thereafter, the dyed anodized parts were exposed to UV light for a period of 300 hours at an intensity of 0.8 W/m2/nm in order to determine whether the dyed anodized parts demonstrated a dE94 color change of less than 3.0 (acceptable threshold). Samples that were dyed and sealed with zinc acetate demonstrated reduced color shift relative to samples that were dyed and sealed with nickel acetate. In particular, dyed anodized parts sealed with zinc acetate yielded between about 30%-70% improvement in reducing color shift. Based on this observation, it may be inferred that zinc acetate attenuates UV light more strongly than nickel acetate.

FIGS. 9A-9B illustrate exemplary charts indicating a relationship of CIE dE94 color change as a function of a type of seal chemistry, in accordance with some embodiments. The anodized parts shown in FIGS. 9A-9B were dyed a variety of different colors, and then subsequently tested for color shift using a dE94 standard over periods of 100 hours, 200 hours, and 300 hours of exposure to UV light at an intensity of 0.8 W/m2/nm.

FIG. 9A illustrated anodized parts that were dyed various shades of gray and black colors. FIG. 9B illustrates anodized parts that were dyed red, orange, and blue colors. As illustrated in FIGS. 9A-9B, the dyed anodized parts sealed with zinc acetate demonstrated, on average, between about 30%-70% improvement in lightfastness over corresponding dyed anodized parts sealed with nickel acetate. Accordingly, anodized parts that include a zinc-based sealant demonstrate significant improvement in lightfastness of UV-sensitive organic dye colorants relative to anodized parts that include a nickel-based sealant.

Figure 10:
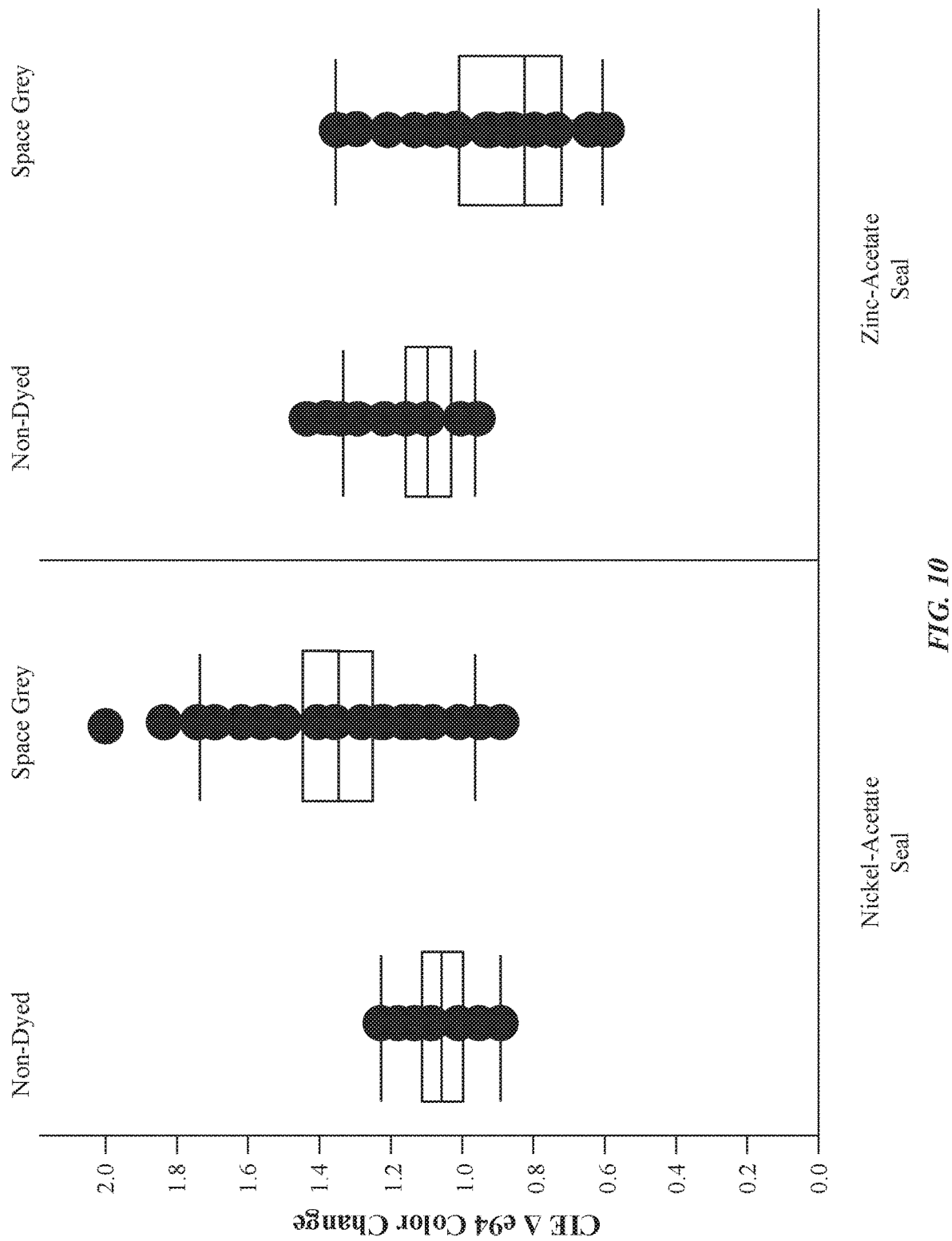
FIG. 10 illustrates an exemplary graph indicating a relationship of CIE dE94 color change as a function of a type of seal chemistry, in accordance with some embodiments.

FIG. 10 illustrates an exemplary graph indicating a relationship of CIE dE94 color change as a function of a type of seal chemistry, in accordance with some embodiments. Anodized parts may be dyed a variety of colors, where the colors can be tuned by adjusting the composition of the dye bath (concentration of colorants, and pH), and by adjusting the time and temperature of the dye bath. By maintaining a constant bath composition, pH and temperature, time may be used to precisely fine-tune color to within DE of <1 of any given color target during production. In some examples, the sealing process is utilized to lock the color of the dyed parts. However, the sealing processes can result in further color changes-perhaps most notably due to bleeding of dye components into the hot aqueous seal bath during the initial stages of sealing. This can be quantified by performing color measurements (e.g. using a reflectance spectrophotometer to quantify color according to a color standard such as CIELab) both before and after the sealing process, and assessing the color change as a dE94 measure of the difference between the two colors.

According to the exemplary trials, samples that were not dyed (i.e. retaining a clear "silver" appearance of the aluminum surface) were sealed using either nickel acetate or zinc acetate. Samples that were non-dyed ("silver" color) and sealed with nickel acetate demonstrated a dE94 color change of between about 0.9 to about 1.2. In contrast, non-dyed samples that were sealed with zinc acetate (3.0 g/L) demonstrated a dE94 color change of between about 0.9 to about 1.3.

However, anodized parts using zinc acetate as a seal imparted significant improvement in resistance to color change than anodized layers using nickel acetate as a seal. As illustrated in FIG. 10, samples that were dyed a "space grey" color of (L*>50) and sealed using nickel acetate demonstrated a dE94 color change of between about 0.8 to about 2.0. In contrast, the samples that were sealed using zinc acetate (3.0 g/L) demonstrated a smaller range of dE94 color change of between about 0.6 to about 1.4. Accordingly, anodized parts sealed using zinc acetate demonstrated significantly less color change than those anodized parts sealed using nickel acetate. Based on this observation, it may be inferred that zinc acetate more quickly plugs and seals the openings 218 of the pore structures 212 relative to nickel acetate during the sealing process.

Figure 11:
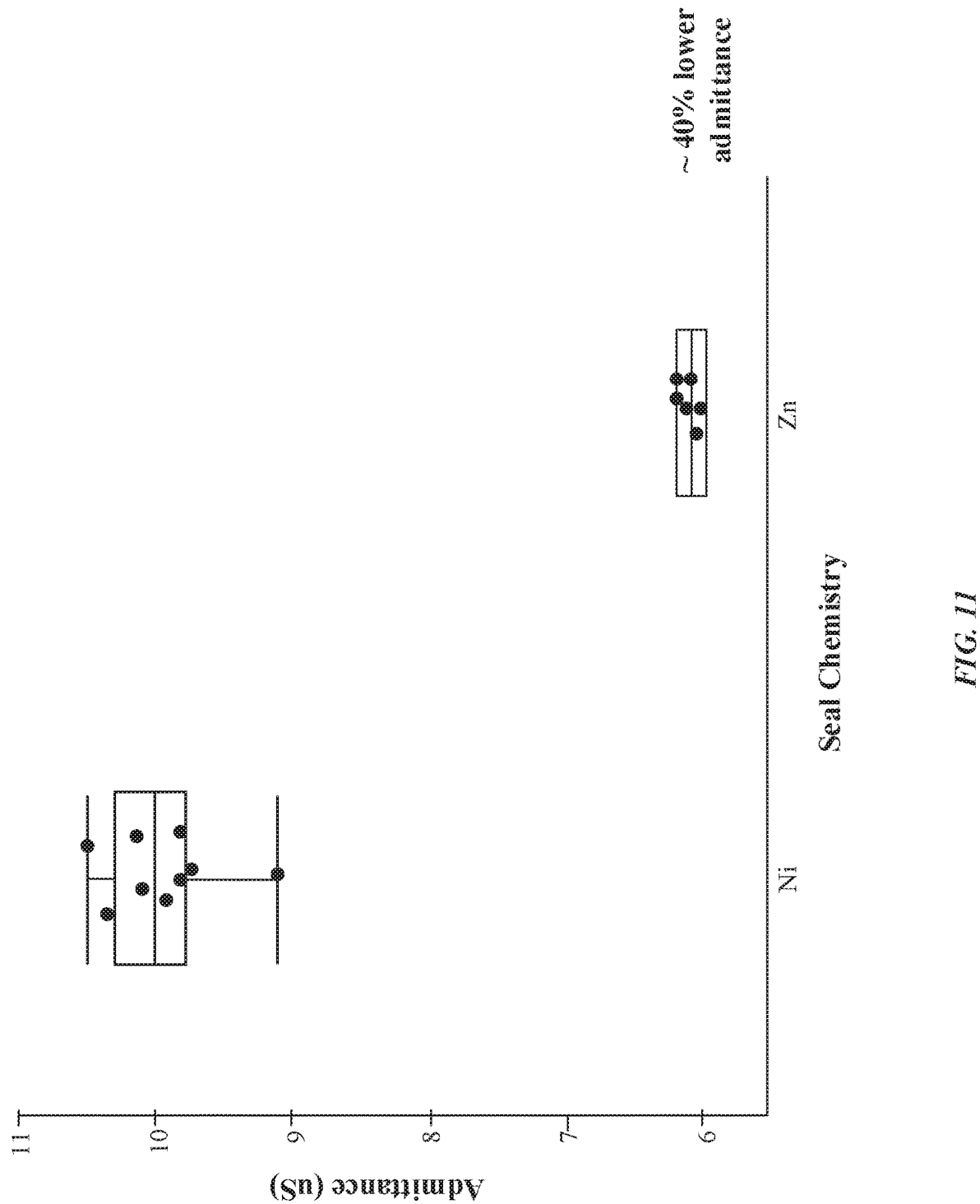
FIG. 11 illustrates an exemplary graph indicating a relationship of an admittance of an anodized layer as a function of a type of seal chemistry, in accordance with some embodiments.

FIG. 11 illustrates a graph indicating a relationship of an admittance of an anodized layer as a function of a type of seal chemistry, in accordance with some embodiments. In particular, admittance (as measured in accordance with ASTM B457) corresponds to an electrochemical resistance of the anodized layer 206. The admittance testing involves performing electrochemical impedance spectroscopy at a fixed frequency (e.g. 1 kHz). A conventional seal (e.g. one with a 1 kHz admittance value (measured in microSiemens in accordance with ISO 2931) of less than 400 times the reciprocal of its thickness (measured in microns)—when measured within 48 h of sealing—a specification set by Qualanod standard.) may be achieved in production by immersion in an aqueous solution of nickel acetate at 5-10 g/l and at temperatures of 96° C. or more, for a period of 15 minutes or more in the case of a Type II anodic oxide film with a film thickness of 10-15 microns.

In accordance with some exemplary trials, otherwise identical anodized parts with similar 12 micrometer anodized layer thickness were sealed using a nickel-base seal and a zinc-based seal at the same active chemistry concentrations, the same temperature, and for the same sealing exposure duration. In particular, anodized parts sealed using nickel acetate demonstrated an admittance value range between about 9 microSiemens to about 11 microSiemens. In contrast, anodized parts sealed using zinc acetate demonstrated about a 40% lower admittance. The anodized parts sealed using zinc acetate had an admittance value of about 6 microSiemens. The decrease in admittance correlates to reduce ionic conductivity of the anodized layer, thereby demonstrating improved corrosion resistance while using zinc-acetate seals.

Figure 12:
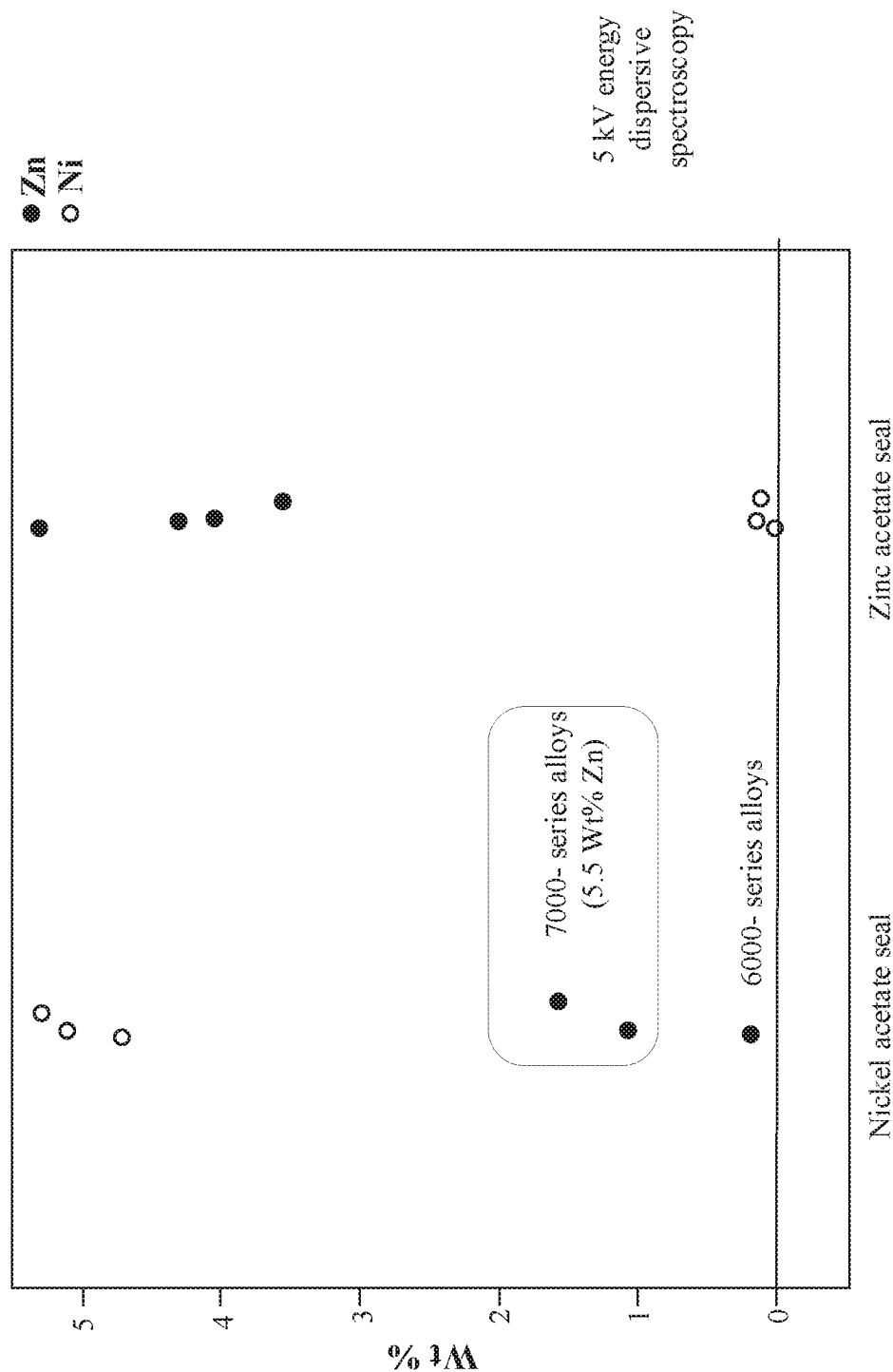
FIG. 12 illustrates an exemplary graph indicating concentrations of nickel/zinc at a surface of an anodized layer as a function of a type of seal chemistry, in accordance with some embodiments.

FIG. 12 illustrates an exemplary graph indicating concentrations of nickel/zinc at a surface of an anodized layer as a function of a type of seal chemistry, in accordance with some embodiments. In particular, samples of anodized parts were exposed to nickel acetate sealing solutions and zinc acetate sealing solutions. These anodized parts were exposed to 5 kV energy dispersive x-ray spectroscopy. FIG. 12 illustrates anodized parts formed of 6000-series alloy having magnesium and silicon as alloying elements. The 6000-series alloy demonstrates about 0 wt % of zinc at the surface of the anodized layer. A baseline 7000-series alloy having 5.5 wt % of zinc was measured to have less than 2 wt % of zinc at the surface of the anodized layer.

As illustrated in FIG. 12, anodized parts were sealed with nickel acetate and zinc acetate. The anodized parts sealed with nickel acetate exhibited a surface concentration of nickel between about 4.5-5.5 wt % and a surface concentration of zinc of about 0 wt %. In contrast, anodized parts sealed with zinc acetate exhibited a surface concentration of zinc between about 4-5.5 wt % and a surface concentration of nickel of about 0 wt %. Accordingly, regardless of the concentration of zinc present in the alloy substrate, there is less than 2 wt % of zinc from the alloy that is incorporated into the anodized layer.

Figure 13:
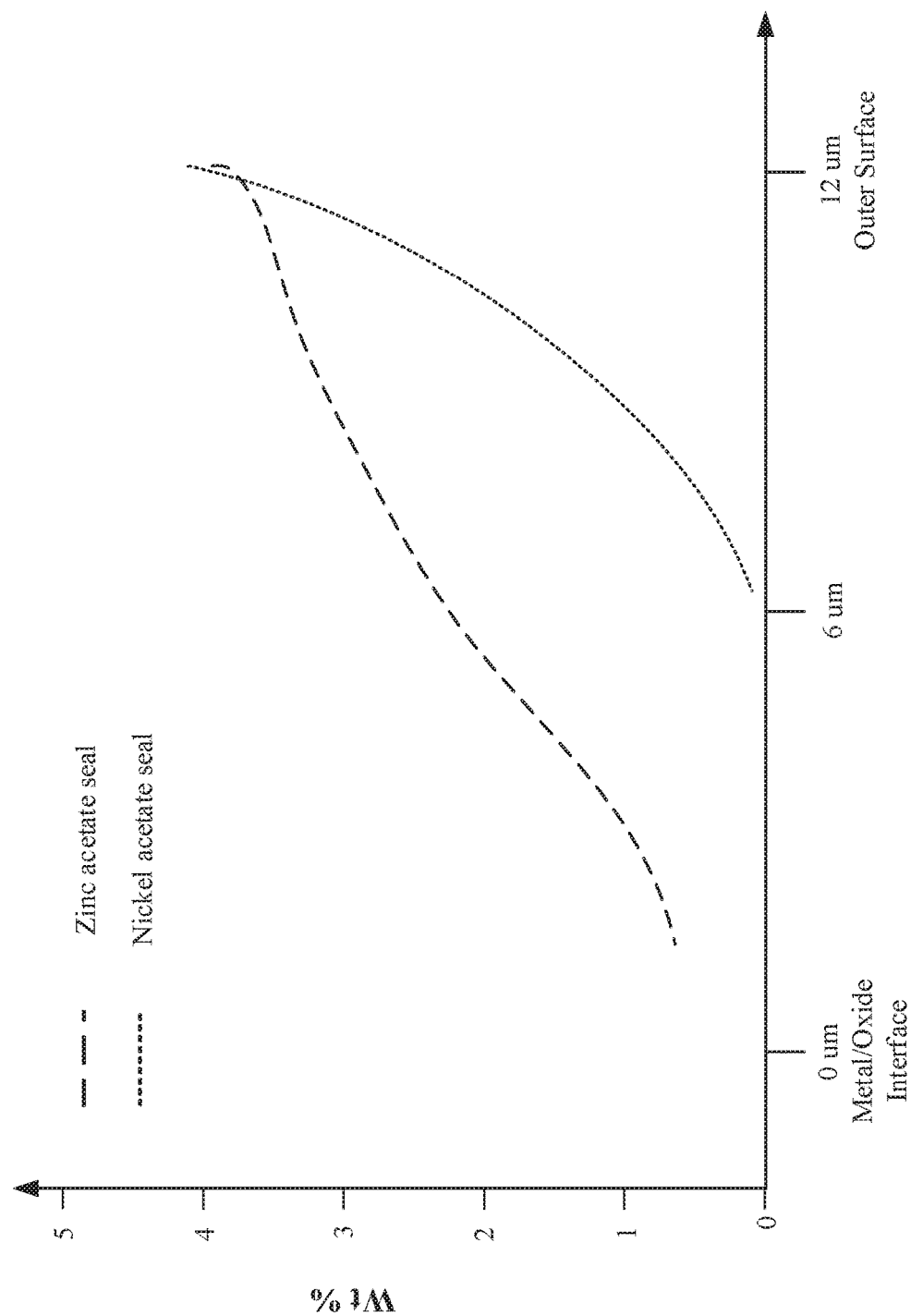
FIG. 13 illustrates an exemplary graph indicating concentrations of nickel/zinc included in an anodized layer as a function of a type of seal chemistry, in accordance with some embodiments.

FIG. 13 illustrates an exemplary graph indicating concentrations of nickel/zinc included in an anodized layer as a function of a type of seal chemistry, in accordance with some embodiments. In particular, samples of anodized parts were exposed to nickel acetate sealing solutions and zinc acetate sealing solutions. The samples of anodized parts had thicknesses of about 12 micrometers.

As illustrated in FIG. 13, the samples of anodized parts that were sealed using zinc acetate demonstrated about 3 wt %-4 wt % of zinc at the external surface of the anodized layer. Notably, at a thickness of 6 micrometers (or 50% of the thickness of anodized layer), the anodized parts sealed using zinc acetate demonstrated a slower drop-off with between about 1 wt %-2 wt % of zinc at 50% of the thickness of the anodized layer.

In contrast, anodized parts sealed using nickel acetate demonstrated about 3-4 wt % of nickel at the surface of the anodized layer. However, at a thickness of 6 micrometers, the anodized parts sealed using nickel acetate demonstrated a sharper drop-off with about 0 wt % of nickel at 50% of the thickness of the anodized layer. Accordingly, these results demonstrate the unexpected result that use of zinc-based seals leads to deeper penetration of zinc ions into the pore structures of the anodized layer. Since the zinc ions penetrate deeper into the pore structures than nickel ions, and these zinc ions reflect the presence the presence of additional metal hydroxide precipitates which help to block the porosity and boost impedance, the anodized layer that is sealed with zinc acetate demonstrates reduced admittance and reduced ionic conductivity relative to the nickel-based seals.

Figure 14A:
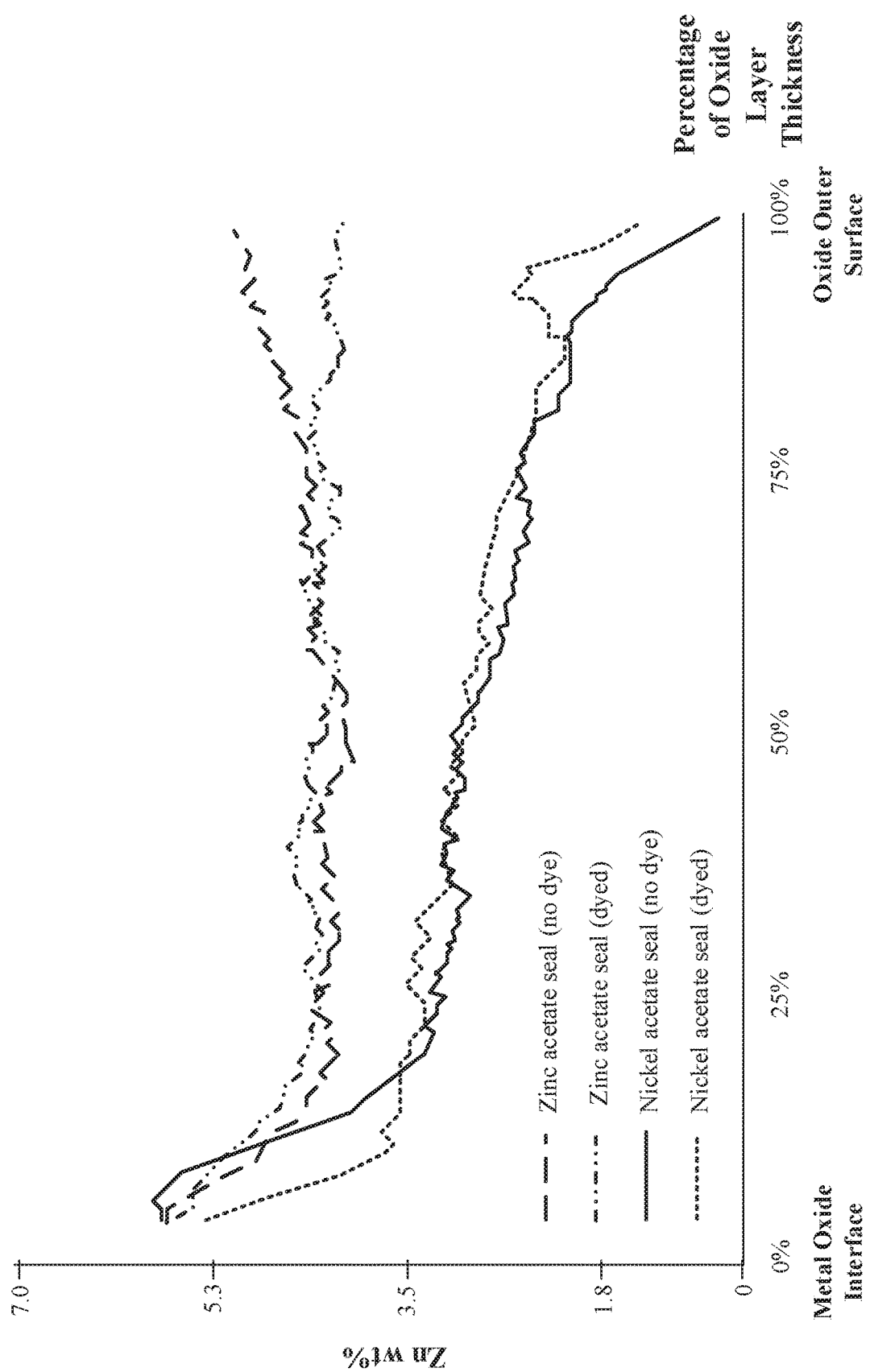
FIGS. 14A-14B illustrate exemplary graphs indicating concentrations of nickel/zinc through a thickness of an anodized layer as a function of a type of seal chemistry, in accordance with some embodiments.
Figure 14B:
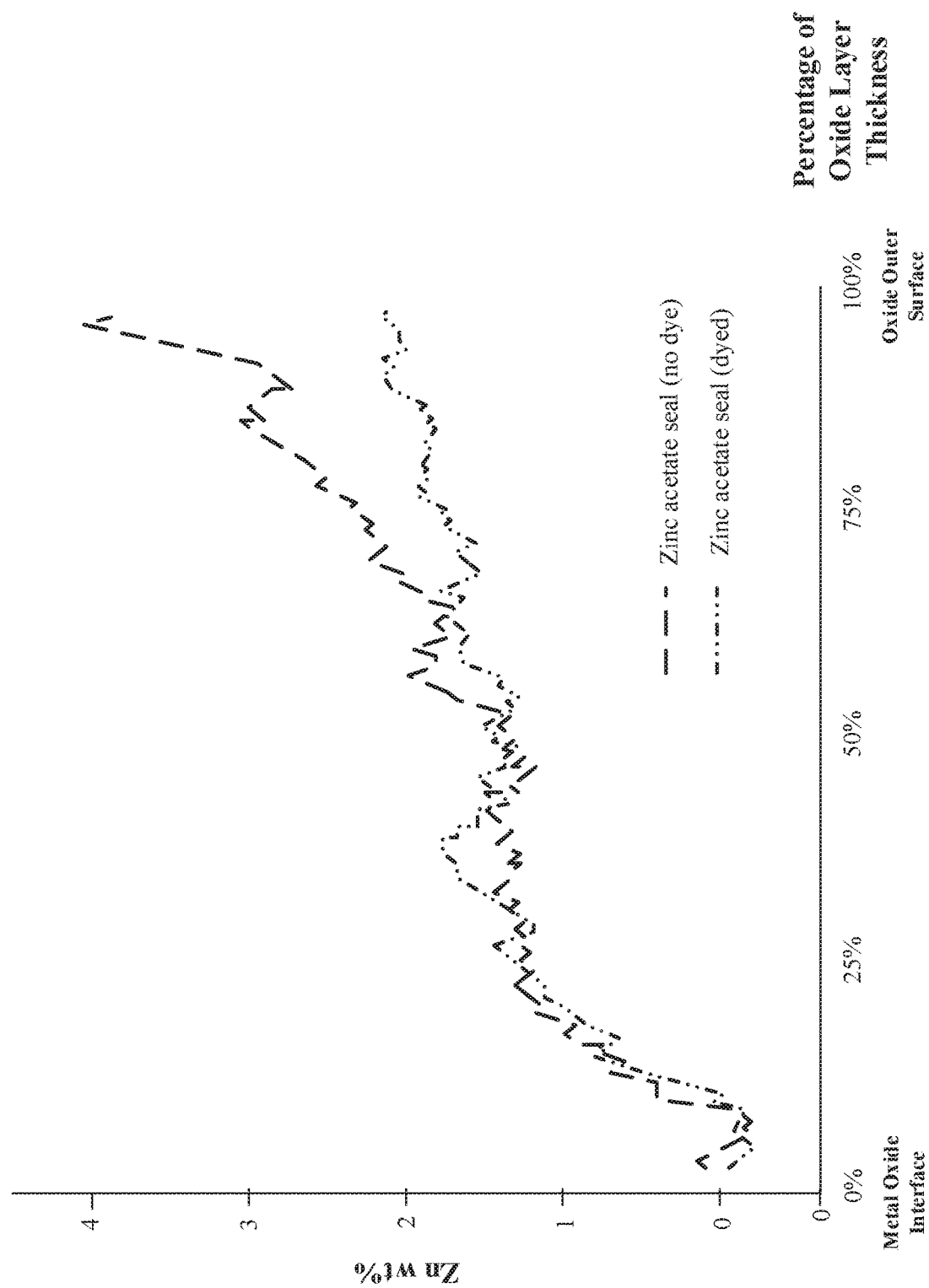

FIGS. 14A-14B illustrate exemplary graphs indicating concentrations of nickel/zinc through a thickness of a metal oxide layer as a function of a type of seal chemistry, in accordance with some embodiments. In particular, anodized parts were derived from a zinc-rich substrate alloy. In particular, dyed anodized parts and non-dyed anodized parts were sealed using nickel acetate and zinc acetate. Energy dispersive x-ray spectroscopy was used to detect a distinctive profile of zinc concentration through the thickness of these anodized parts that were sealed using nickel acetate and zinc acetate. In particular, these anodized parts were derived from a zinc-rich substrate alloy. Other tests such as X-ray fluorescence (XRF) may also be used.

FIG. 14A illustrates that dyed anodized parts and non-dyed anodized parts that were sealed using nickel acetate demonstrated a highest concentration of zinc at the metal substrate/metal oxide interface of about 5 wt %. However, the concentration of zinc decreased towards the external surface of the metal oxide layer to about 0 wt % of zinc at the external surface. One of ordinary skill in the art would have inferred that the highest concentration of zinc at the metal substrate/metal oxide interface is not unexpected because zinc ions that diffuse from the zinc-rich substrate alloy are likely to taper off in concentration towards the external surface.

Contrarily, FIG. 14A illustrates that those anodized parts that were sealed using zinc acetate demonstrated about 4 wt %-5 wt % of zinc throughout the thickness of the metal oxide layer, regardless of whether these anodized parts were dyed or non-dyed. Additionally, FIGS. 14A-14B illustrate the surprising and unexpected result that anodized parts sealed using zinc acetate show a relatively uniform concentration of zinc throughout the thickness of the metal oxide layer. In other words, the concentration of zinc cannot be solely attributed to the zinc-rich based alloy. As such, zinc ions from the zinc acetate sealing solution are incorporated into the metal oxide layer from the zinc-rich substrate are readily dissolved in the acidic anodizing bath and are likely to taper off in concentration towards the external surface which experiences longer exposure time to the acidic anodizing bath.

FIG. 14B illustrates an exemplary graph that demonstrates the Δ in wt % of zinc throughout the thickness between anodized parts sealed using zinc acetate and those anodized parts sealed using nickel acetate. FIG. 14B illustrates that the Δ in wt % of zinc is greatest at the outer surface of the metal oxide layer.

Figure 15:
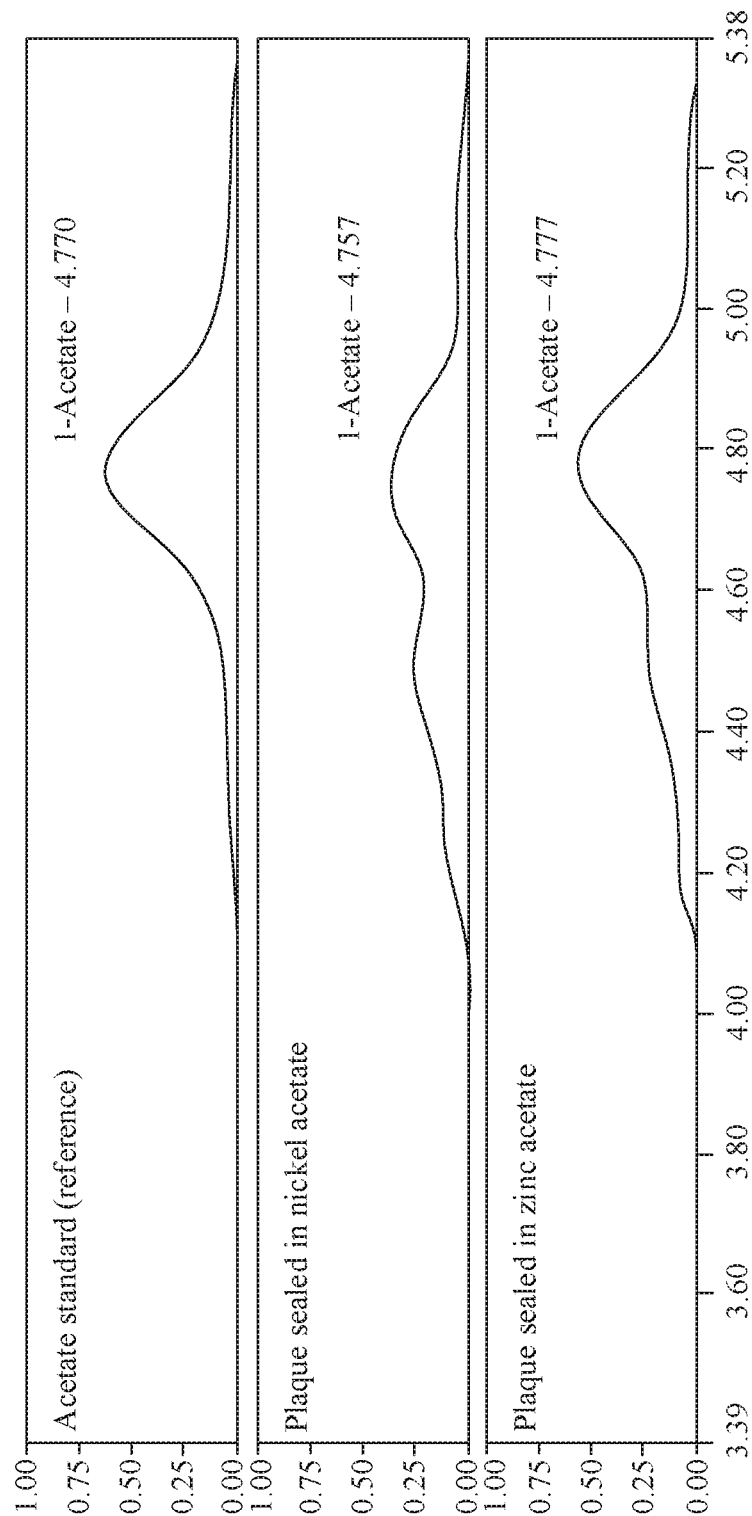
FIG. 15 illustrates an exemplary graph indicating concentrations of nickel acetate/zinc acetate in an anodized layer as a function of a type of seal chemistry, in accordance with some embodiments.

FIG. 15 illustrates an exemplary graph indicating concentrations of nickel acetate and zinc acetate in a metal oxide layer as a function of a type of seal chemistry, in accordance with some embodiments. In particular, anodized parts were sealed using nickel acetate and zinc acetate. In the exemplary trials, ultra pure water (UPW) extraction (2 hours at 50° C.) was performed on these samples. Ion chromatography was used to detect the presence of acetate anions in those anodized parts that were sealed using nickel acetate and zinc acetate. FIG. 15 illustrates that an anodized part sealed using an acetate standard, an anodized part sealed using nickel acetate, and an anodized part sealed using zinc acetate all demonstrated detectable amounts of acetate anions.

Any ranges cited herein are inclusive. The terms "substantially", "generally," and "about" used herein are used to describe and account for small fluctuations. For example, they can refer to less than or equal to ±5%, such as less than or equal to ±2%, such as less than or equal to ±1%, such as less than or equal to ±0.5%.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a non-transitory computer readable medium. The non-transitory computer readable medium is any data storage device that can store data which can thereafter be read by a computer system. Examples of the non-transitory computer readable medium include read-only memory, random-access memory, CD-ROMs, HDDs, DVDs, magnetic tape, and optical data storage devices. The non-transitory computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for forming an enclosure for a portable electronic device, the enclosure including a metal substrate that is overlaid by an anodized layer, the method comprising:
   dyeing the anodized layer by exposing pores of the anodized layer to a dye; and
   sealing the dye within the pores by exposing the anodized layer to a zinc-based sealing solution, wherein an external surface of the anodized layer having the pores that are sealed includes an amount of zinc between about 3 wt % to about 6 wt %, and wherein an external concentration of zinc at the external surface of the anodized layer is greater than an internal concentration of zinc that corresponds to an internal region of the anodized layer.

2. The method of claim 1, wherein the anodized layer is dyed with a dye solution including the dye, and the dye solution includes a concentration of zinc that contributes to the amount of zinc at the external surface.

3. The method of claim 2, wherein, subsequent to dyeing the anodized layer, the method further comprises:
   rinsing the dye solution with a buffer that includes between about 1 g/l to about 20 g/l of zinc.

4. The method of claim 2, wherein the dye solution includes zinc acetate or zinc sulfate.

5. The method of claim 1, wherein the anodized layer is formed by exposing the metal substrate to an electrolytic anodizing solution, and subsequent to exposing the metal substrate to the electrolytic anodizing solution, the method further comprises:
   rinsing the electrolytic anodizing solution with a buffer that includes zinc acetate.

6. The method of claim 1, wherein the zinc-based sealing solution includes between about 1 g/l to about 20 g/l of zinc.

7. The method of claim 1, wherein the metal substrate includes 2 wt % of zinc.

8. An enclosure for a portable electronic device, the enclosure comprising:
   a metal alloy substrate; and
   an anodized layer formed from and overlaying the metal alloy substrate, wherein the anodized layer includes (i) pores having dye disposed therein, and (ii) a sealant that seals the dye within the pores of the anodized layer, wherein an external concentration of zinc at an external surface of the anodized layer includes between about 3 wt % to about 6 wt % of zinc and is greater than an internal concentration of zinc that corresponds to an internal region of the anodized layer.

9. The enclosure of claim 8, wherein the sealant is a zinc-based sealant.

10. The enclosure of claim 8, wherein the metal alloy substrate is a zinc-based alloy, and the anodized layer includes zinc that is diffused from the metal alloy substrate.

11. The enclosure of claim 10, wherein the zinc diffused from the metal alloy substrate accounts for no greater than about 1 wt % of the external concentration of zinc at the external surface.

12. The enclosure of claim 8, wherein the pores are defined by pore walls, and the pore walls are swelled with the sealant to plug the pores.

13. The enclosure of claim 8, wherein the anodized layer is characterized as having an admittance value that is less than 20 microSiemens and a hardness value that is greater than 320 HV0.05.

* * * * *